(12) United States Patent
Matsuo et al.

(10) Patent No.: US 8,072,760 B2
(45) Date of Patent: *Dec. 6, 2011

(54) POWER INVERTER

(75) Inventors: Takeshi Matsuo, Hitachinaka (JP); Haruki Hamada, Naka (JP); Atsuo Nishihara, Kashiwa (JP); Masanori Musou, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/759,824

(22) Filed: Apr. 14, 2010

(65) Prior Publication Data

US 2011/0032676 A1 Feb. 10, 2011

Related U.S. Application Data

(63) Continuation of application No. 11/581,336, filed on Oct. 17, 2006, now Pat. No. 7,710,721.

(30) Foreign Application Priority Data

Apr. 27, 2006 (JP) .................................. 2006-122885

(51) Int. Cl.
*H05K 7/20* (2006.01)

(52) U.S. Cl. ....... 361/707; 361/699; 361/719; 165/80.4; 165/104.33

(58) Field of Classification Search .................. None
See application file for complete search history.

(56) References Cited

U.S. PATENT DOCUMENTS

| 5,455,458 | A | * | 10/1995 | Quon et al. .................... 257/714 |
| 5,504,378 | A | * | 4/1996 | Lindberg et al. ............. 307/10.1 |
| 5,966,291 | A | | 10/1999 | Baumel et al. |
| 6,016,007 | A | | 1/2000 | Sanger et al. |

(Continued)

FOREIGN PATENT DOCUMENTS

JP 2005-259748 9/2005

(Continued)

*Primary Examiner* — Boris Chervinsky
(74) *Attorney, Agent, or Firm* — Antonelli, Terry, Stout & Kraus, LLP.

(57) ABSTRACT

Water paths for feeding a coolant water through a power converter mounted on an automobile are arranged in parallel, openings are formed on the water paths respectively, heat radiating fins project from the openings, and the openings are closed by a base plate of the power module. Further, the base plate of the power module includes a metal in addition to copper to increase a hardness of the base plate, so that a deterioration of the flatness during fixing the fins with brazing is restrained.

8 Claims, 26 Drawing Sheets

U.S. PATENT DOCUMENTS

| | | | |
|---|---|---|---|
| 6,166,937 A * | 12/2000 | Yamamura et al. | 363/141 |
| 6,245,442 B1 * | 6/2001 | Towata et al. | 428/614 |
| 6,310,775 B1 | 10/2001 | Nagatomo et al. | |
| 6,414,867 B2 | 7/2002 | Suzuki et al. | |
| 6,442,023 B2 | 8/2002 | Cettour-Rose et al. | |
| 6,661,659 B2 | 12/2003 | Tamba et al. | |
| 6,782,745 B1 * | 8/2004 | Zurek et al. | 73/204.22 |
| 6,865,080 B2 | 3/2005 | Radosevich et al. | |
| 6,960,278 B2 | 11/2005 | Petitbon et al. | |
| 6,961,244 B2 | 11/2005 | Tsuchiya et al. | |
| 6,978,856 B2 | 12/2005 | Nakamura et al. | |
| 6,987,670 B2 | 1/2006 | Ahmed et al. | |
| 6,992,887 B2 | 1/2006 | Jairazbhoy et al. | |
| 7,019,975 B2 * | 3/2006 | Nagatomo et al. | 361/704 |
| 7,031,161 B2 | 4/2006 | Miettinen et al. | |
| 7,090,044 B2 | 8/2006 | Nakamura et al. | |
| 7,190,581 B1 | 3/2007 | Hassani et al. | |
| 7,206,205 B2 * | 4/2007 | Obu et al. | 361/704 |
| 7,289,329 B2 | 10/2007 | Chen et al. | |
| 7,301,755 B2 | 11/2007 | Rodriguez et al. | |
| 7,505,294 B2 * | 3/2009 | Ahmed et al. | 363/141 |
| 2001/0014029 A1 | 8/2001 | Suzuki | |
| 2005/0006963 A1 | 1/2005 | Takenaka et al. | |
| 2005/0083655 A1 | 4/2005 | Jairazbhoy et al. | |
| 2007/0236883 A1 * | 10/2007 | Ruiz | 361/699 |
| 2008/0049476 A1 | 2/2008 | Azuma et al. | |

FOREIGN PATENT DOCUMENTS

| | | |
|---|---|---|
| WO | WO 03/088728 | 10/2003 |
| WO | WO 2005/051063 | 6/2005 |

* cited by examiner

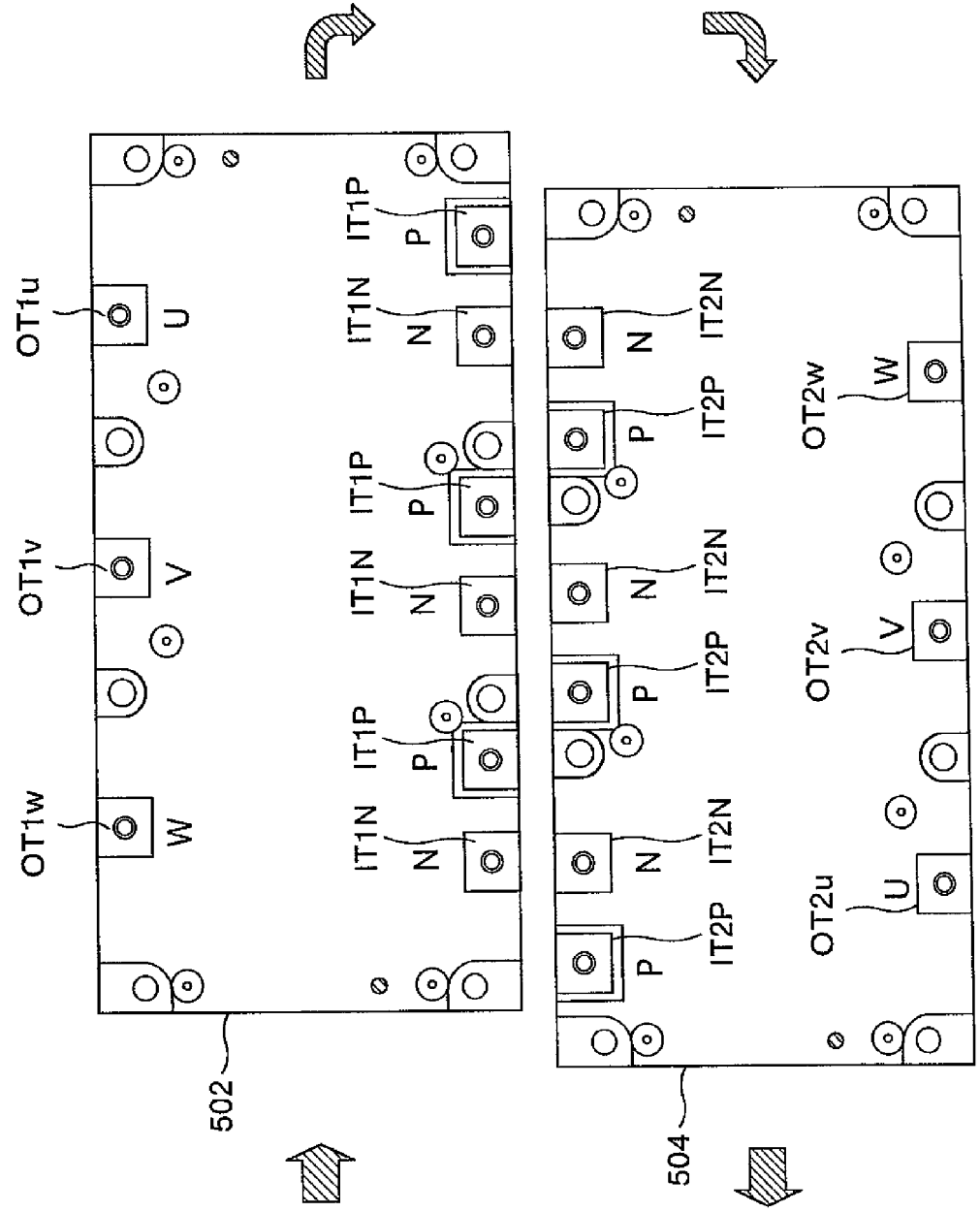

POWER INVERTER

CROSS REFERENCE TO RELATED APPLICATION

This application is a Continuation of U.S. application Ser. No. 11/581,336, filed Oct. 17, 2006, now U.S. Pat. No. 7,710,721 which claims priority from Japanese Patent Application No. 2006-122885, filed on Apr. 27, 2006, the contents of which are incorporated herein by reference.

BACKGROUND OF THE INVENTION

The present invention relates to an electric power inverter, for example, a power inverter preferable for being mounted on a vehicle.

A typical electric automobile driven by an output power of a motor instead of an internal combustion engine, and a hybrid-type electric automobile driven by using together the internal combustion engine and the motor exist. On such automobile, a rotary motor and a power converter for supplying electric power to the rotary motor are mounted.

The power converter has a function of converting a direct current electric power to an alternating current electric power to drive the rotary motor, and may further have a function of converting the alternating current electric power generated by the rotary motor to the direct current electric power to be supplied to a secondary battery. For obtaining these functions, the power converter includes a semiconductor module to form an inverter, a control circuit for controlling the semiconductor and a capacitor.

A cooling of a semiconductor constituting an inverter is disclosed by JP-A-2005-259748.

BRIEF SUMMARY OF THE INVENTION

An object of the present invention is to provide a power converter in which a cooling efficiency is further improved.

A distinctive feature of the invention is that an opening is formed on a cooling path for streaming a coolant and a heat radiating fin for cooling a semiconductor module projects from the opening into the cooling path so that the semiconductor module is cooled further efficiently and a cooling efficiency for a power converter is further improved. The heat radiating fin is joined with the semiconductor by, for example, brazing.

Another distinctive feature of the invention is that the opening is formed on the cooling path for streaming the coolant and the heat radiating fin for cooling the semiconductor module projects from the opening into the cooling path and the opening is closed by a base plate onto which the heat radiating fin is fixed so that the semiconductor module is cooled further efficiently and a cooling efficiency for a power converter is further improved.

The other distinctive feature is explained in embodiments.

The invention brings about an advantage of that the cooling efficiency for the semiconductor module is improved to provide the power converter in which the cooling efficiency is further improved.

In first and second embodiments as described below, the heat radiating fin is mounted on the semiconductor module, and the heat radiating fin projects into a cooling water passage as the cooling path so that the heat radiating fin is cooled by the cooling water as the coolant to cool the semiconductor module and the control circuit or smoothing capacitor module for the semiconductor module, so that the power converter can be cooled further efficiently.

In the first and second embodiments as described below, there is a further effect of that a flatness of a heat radiating base plate as a base plate of the semiconductor module is kept accurately, and it is obtainable easily. Further, a plurality of insulating substrates each including a plurality of semiconductor chips may be adhered in common to the base plate so that a reliability in adhesion of the insulating substrates is high and a heat radiating efficiency of the semiconductor module is kept high.

In the below embodiments, the heat radiating fin is fixed to the semiconductor module. The heat radiating fin is fixed to one of surfaces of the base plate of the semiconductor module by brazing. In the brazing process, the base plate needs to be heated to a high temperature. When the base plate is made of a copper plate of superior thermal conductivity, pure copper has the superior thermal conductivity, but causes a problem of that it is softened by being heated to the high temperature in the brazing process to make the adhesion of the insulating substrate with the semiconductor chip on its reverse surface difficult. If the copper forming the base plate includes impurity, its hardness is increased to solve the problem so that the flatness of the surface to which surface the insulating substrate with the semiconductor chip is adhered is kept to make the process of adhering the semiconductor chip to the base plate easy. On the other hand, a decrease in thermal conductivity causes a further problem. That is, antithetic developments occur, and it is preferable for a content of the impurity to be adjusted.

These problems are not significant when the insulating substrate with the semiconductor chip is small. An increase in voltage and electric current supplied to the rotary motor mounted on the automobile causes an increase in size of the insulating substrate of the semiconductor module. Further, it is preferable for operability that the plurality of the semiconductor chips are adhered to the insulating substrate. Further, it is desired that the plurality of the insulating substrates are adhered in common to the metallic base plate. In this case, the insulating substrate becomes great and an area of the base plate is enlarged to emphasize the above problem. In the embodiment 1 and embodiment 2 as described below, a relationship between the hardness and thermal conductivity of the base plate is clarified to solve the problem.

Further, in the structure and producing process of the embodiments 1 and 2 as described below, the semiconductor module is relatively easily mounted onto the heat radiating base plate, and the high reliability is maintained during use in many years.

In the embodiments 1 and 2, an efficiency of thermal conduction between the coolant and the semiconductor module is high, and the cooling is performed with high reliability.

In the embodiments 1 and 2, a coolant for engine is usable as the coolant so that it is further easily mounted on the vehicle to simplify a driving system. For using the coolant for engine, a structural relationship between the coolant water passage and the heat radiating fin is improved in the above embodiments. Further, a connecting structure between the cooling path and the smoothing capacitor is improved.

In the first and second embodiments of the power converter for controlling two rotary motors, a structure of the whole of it is simple, and the high cooling efficiency is obtained. Further, such converter is easily produced.

Other objects, features and advantages of the invention will become apparent from the following description of the embodiments of the invention taken in conjunction with the accompanying drawings.

BRIEF DESCRIPTION OF THE SEVERAL VIEWS OF THE DRAWINGS

FIG. 21 is an arrangement view of the power module of the invention.

DETAILED DESCRIPTION OF THE INVENTION

First Embodiment

<<Electric Automobile>>

Figure 1:
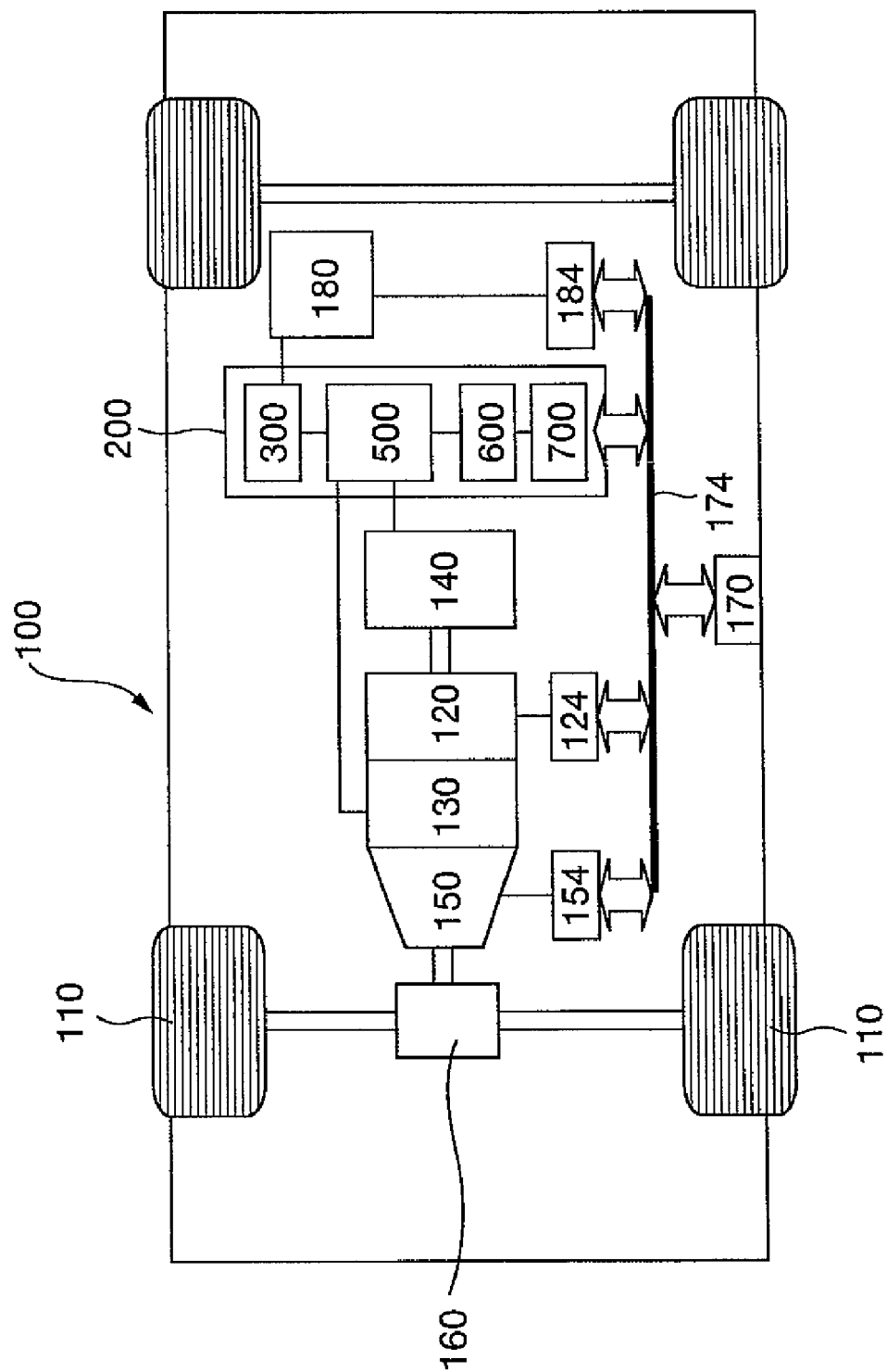
FIG. 1 is a system diagram showing an embodiment of electric motorcar including a power converter of the invention.

FIG. 1 is a structural view showing an embodiment of a hybrid-type electric automobile including the power converter of the invention. Incidentally, the power converter 200 of the invention is applicable to the pure electric automobile and the hybrid-type electric automobile, and the embodiment of the hybrid-type electric automobile is explained below.

On the hybrid-type electric automobile 100, an engine 120, the first rotary motor 130, the second rotary motor 140 and a battery 180 for supplying a direct current of high voltage to the first rotary motor 130 and the second rotary motor 140 are mounted. Further, a battery for supplying a low voltage electric current (14V electric power) is mounted to supply the direct current electric power to a control circuit described below, but it is not shown in the drawings.

A rotational torque by the engine 120, the first rotary motor 130 and the second rotary motor 140 are transmitted to a transmission 150 and a differential gear 160 to be transmitted to front wheels 110.

A transmission controller 154 for controlling the transmission 150, an engine controller 124 for controlling the engine 120, the rotary motor control circuit on a rotary motor control circuit substrate 700 for controlling the power converter 200, a battery controller 184 for controlling a battery 180 of lithium ion battery or the like, and a main controller 170 are connected to each other by communication circuit lines 174.

The main controller 170 receives through the communication circuit lines 174 information indicating conditions of the transmission controller 154, the engine controller 124, the power converter 200 and the battery controller 184 as lower level controllers. On the basis of the information, the main controller 170 calculates controlling order for each controller to be transferred to each controller through the communication circuit lines 174. For example, the battery controller 184 reports to the main controller 170 electric discharge condition of the battery 180 of lithium ion battery and condition of each of unit cells constituting the lithium ion battery as conditions of the battery 180. When the main controller 170 decides that an electric charge of the battery 180 is necessary from the above report, the power converter is ordered to generate an electrical energy. Further, the main controller 170 manages output torques of the engine 120 and the first and second rotary motors 130 and 140, and calculates a total amount of or a torque distribution ratio among the output torques of the engine and the first and second rotary motors 130 and 140, so that control orders based on the calculation results are output to the transmission controller 154, the engine controller 124 and the power converter 200. The power controller 200 controls the first rotary motor 130 and the second control motor 140 on the basis of the torque order so that at least one of the rotary motors is controlled to generate the ordered torque output or the electric power.

The power converter 200 controls switching operation of a power semiconductor forming the inverter to operate the first rotary motor 130 and the second power converter 140 on the basis of the order from the main controller 170. By the switching operation of the power semiconductor, the first rotary motor 130 and the second power converter 140 are operated as motors or electric power generators.

When being operated as the motors, the direct current electric power is applied from the high-voltage battery 180 to the inverter of the power converter 200 while the switching operation of the power semiconductor forming the inverter is controlled to convert the direct current electric power to a three-phase alternating current to be supplied to the rotary motor 130 or 140. On the other hand, when being operated as the electric power generators, a rotor of the rotary motor 130 or 140 is rotated by a rotational torque supplied from the outside to generate the three-phase alternating current power on a stator of the rotary motor from the rotational torque. The generated three-phase alternating current power is converted by the power converter 200 to the direct current electric power to be supplied to the high voltage battery 180 so that the battery 180 is electrically charged by the direct current electric power.

As shown in FIG. 1, the power converter 200 is constituted by a capacitor module 300 including a plurality of smoothing capacitors for restraining a variation in voltage of the direct current electric source, a power module 500 including a plurality of the power semiconductors, a substrate (hereafter called as a switching drive circuit substrate) 600 including a switching drive circuit for controlling the switching operation of the power module, and a substrate (hereafter, called as a rotary motor control circuit substrate) 700 including a rotary motor control circuit for generating a PWM signal to control a pulse width modulation as a signal for determining a width of time period in the switching operation.

The high voltage battery 180 is the secondary battery of lithium ion battery or nickel hydride battery to generate the direct current electric power of high voltage not less than 250-600 V.

<<General Construction of Power Converter>>

Figure 2:
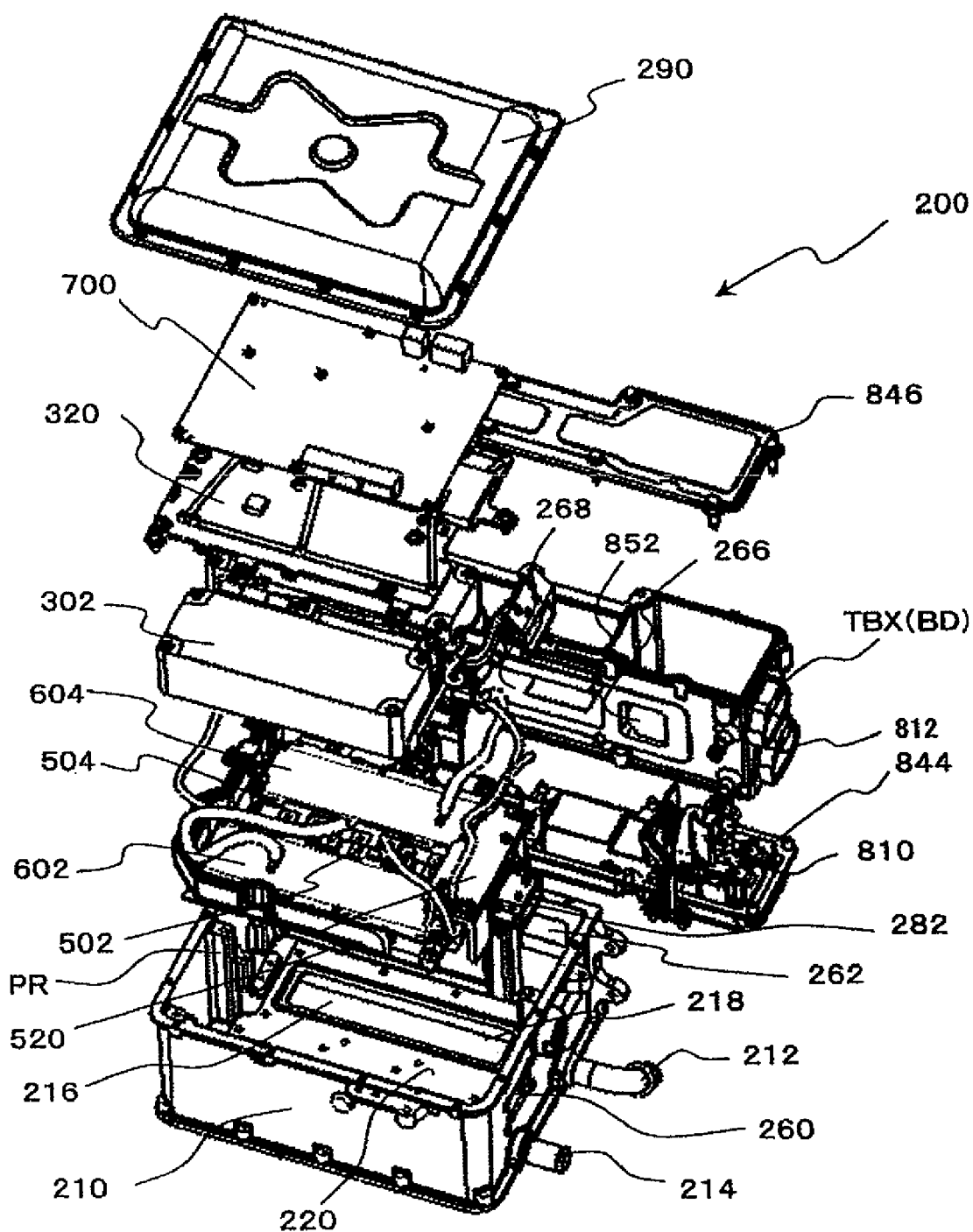
FIG. 2 is an exploded oblique projection view of the power converter of the invention.
Figure 3:
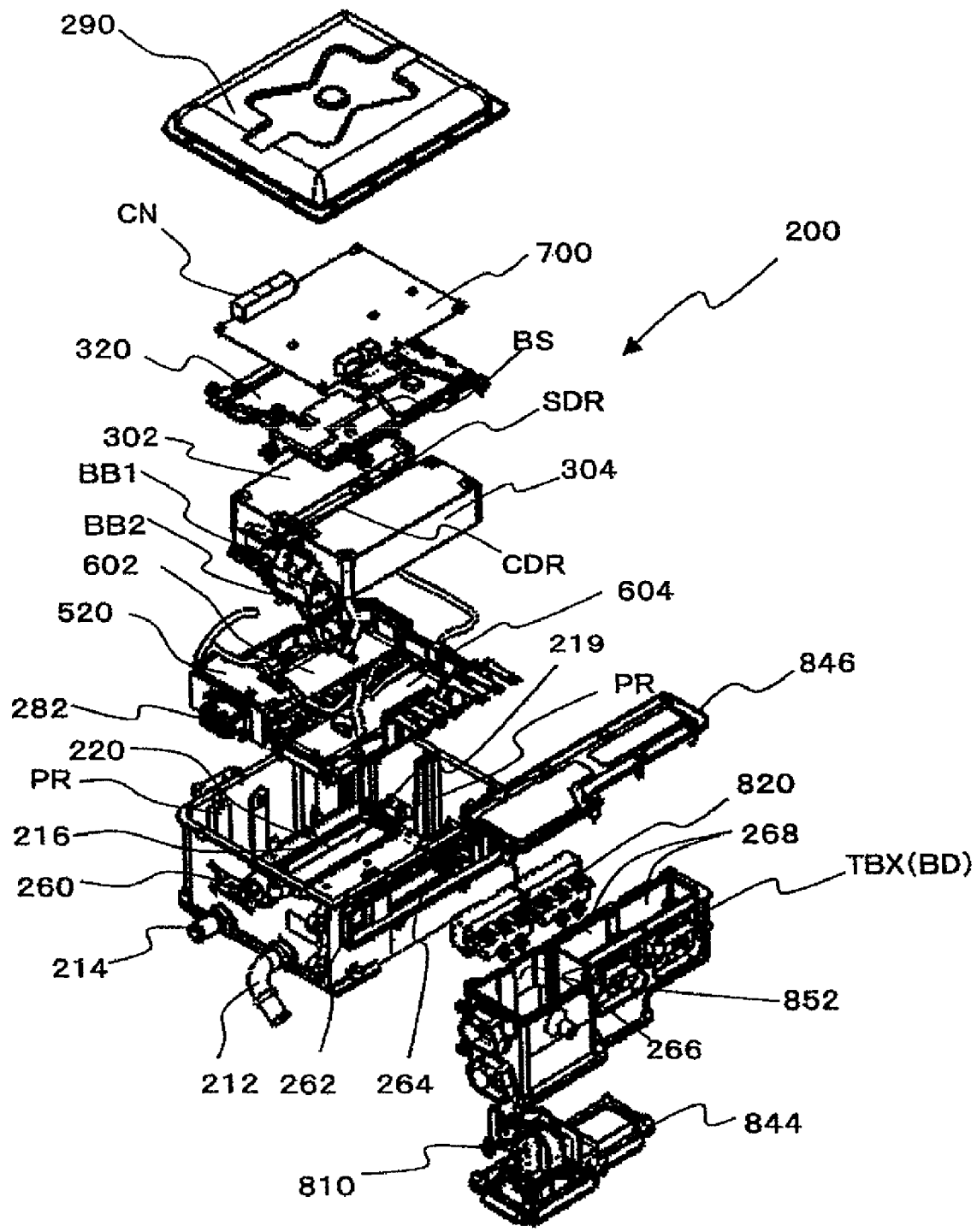
FIG. 3 is an exploded oblique projection view of the power converter of the invention as seen in a direction different from a direction of FIG. 2.
Figure 4:
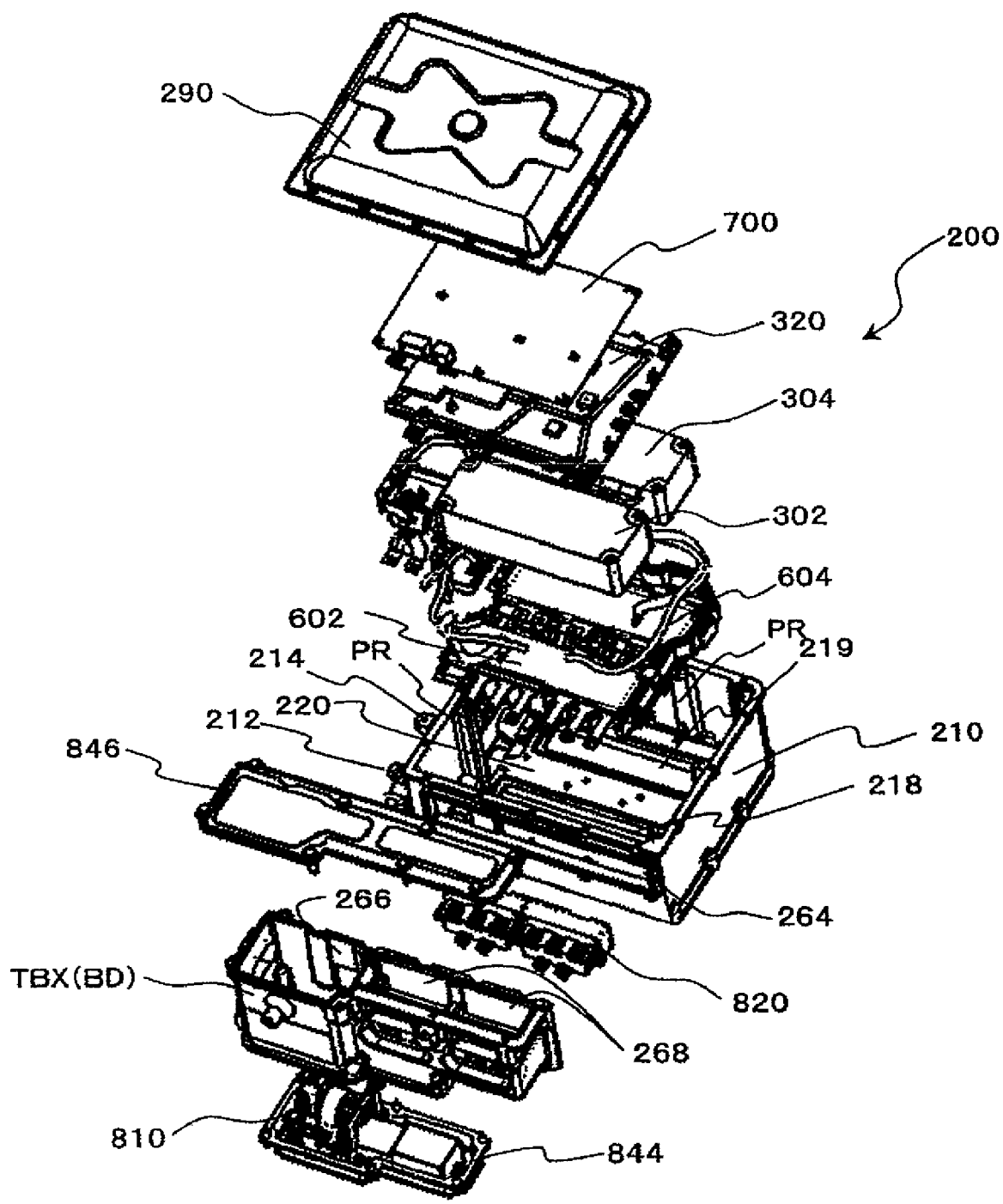
FIG. 4 is an exploded oblique projection view of the power converter of the invention as seen in a direction different from the directions of FIGS. 2 and 3.
Figure 5:
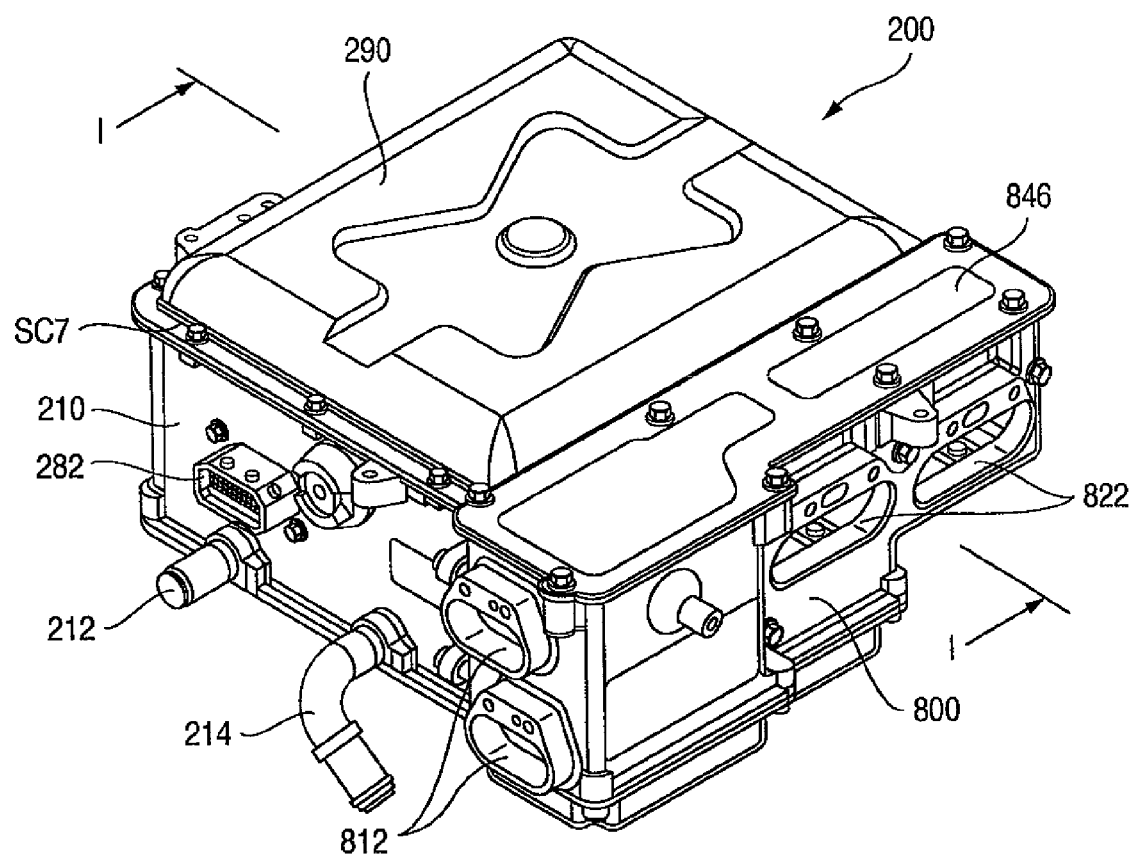
FIG. 5 is an oblique projection outer view of an embodiment of power converter of the invention.
Figure 6:
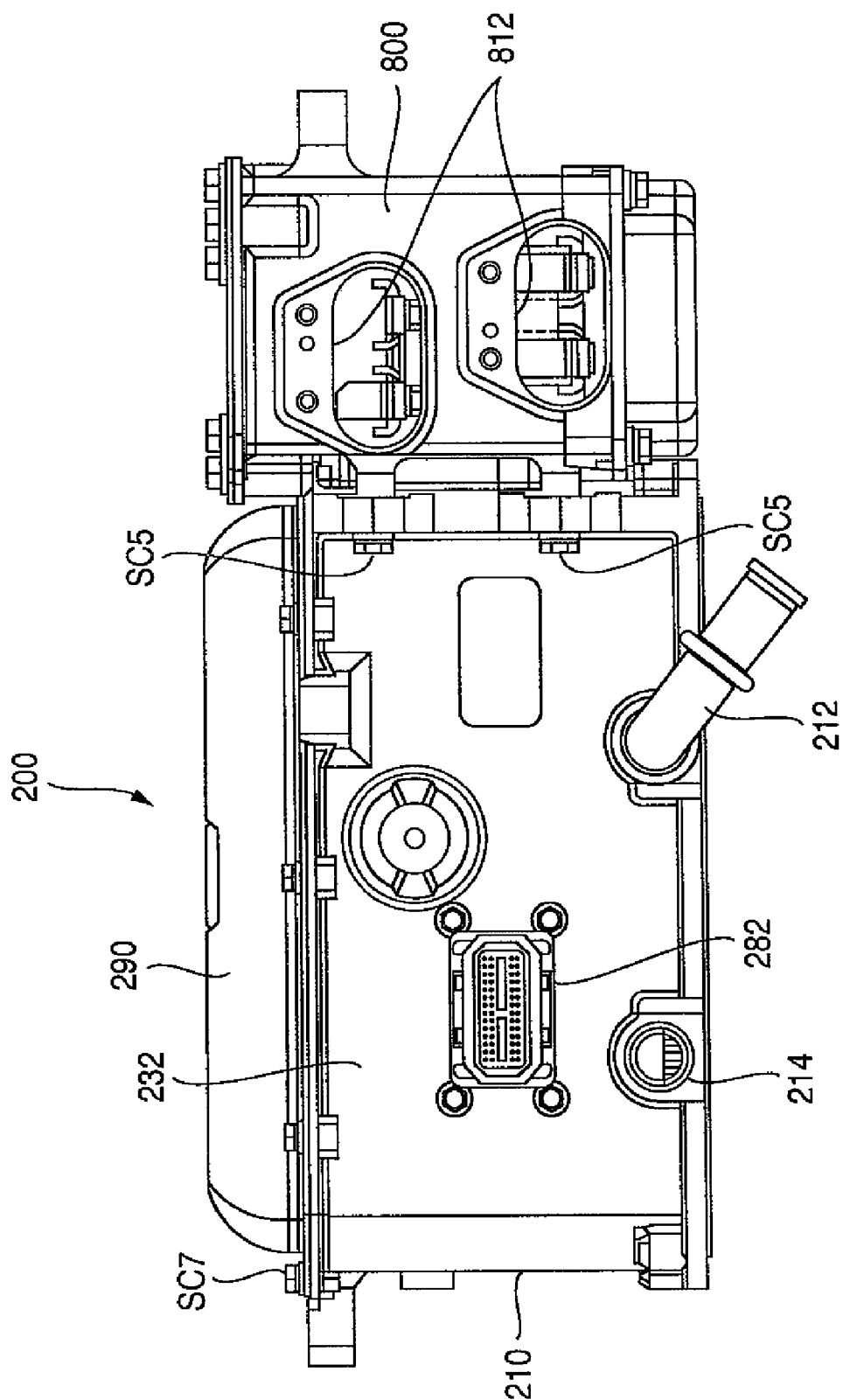
FIG. 6 is an oblique projection outer view of the embodiment of power converter of the invention as seen from a front side surface.
Figure 7:
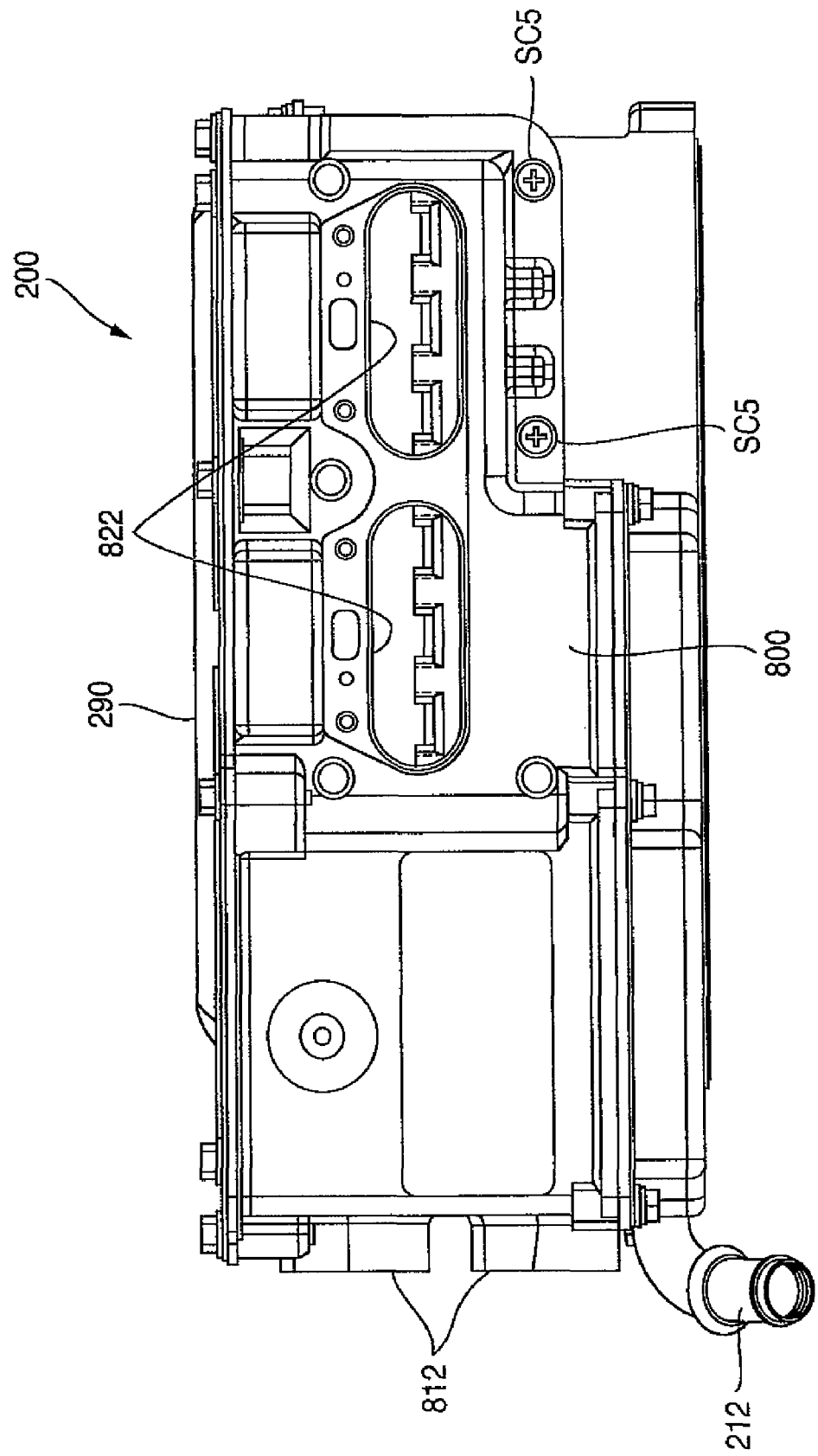
FIG. 7 is a side view of the embodiment of power converter of the invention as seen from a side at which a terminal box is attached.

FIGS. 2, 3 and 4 are exploded oblique projection views of the power converter 200 to show schematically a general construction of the power converter 200. FIGS. 2, 3 and 4 are the exploded oblique projection views as seen in respective directions different from each other. FIGS. 5, 6 and 7 are outline views of the power converters 200, and FIGS. 6, 7 are the outlines views as seen in respective directions different from that of FIG. 5.

The power converter 200 has a housing 210 of box shape at a bottom which a water passage forming body 220 including a coolant water path 216 as a cooling path for circulating the coolant water is arranged. At the bottom of the housing 210, inlet pipe 212 and outlet pipe 214 for supplying the coolant water to the coolant water path 216 project to an outside of the housing 210. The water passage forming body 220 has a function as a coolant path forming body forming the cooling passage, and an engine coolant is used as the coolant in this embodiment so that the structure 220 has the function as the coolant water path forming body.

The power module 500 in FIG. 1 is constituted by first and second power modules 502 and 504 juxtaposed with each other in the housing 210. The first and second power modules 502 and 504 have respective heat radiating fins 506 and 507 for cooling. On the other hand, the water passage forming body 220 has openings 218 and 219. By fixing the first and second power modules 502 and 504 onto the water passage forming body 220, the heat radiating fins 506 and 507 for cooling project into the water path 216 from the openings 218 and 219 respectively. The openings 218 and 219 are closed by metallic walls around the heat radiating fins 506 and 507 to prevent the coolant water from leaking from the openings and to form the coolant water path.

The first and second power modules 502 and 504 are arranged at respective sides to which a side wall surface of the housing 210 with the coolant water inlet pipe 212 and the coolant water outlet pipe 214 thereon is divided by an imaginary line perpendicular to the side wall surface. The coolant water path formed in the water passage forming body 220 extends from the coolant water inlet pipe 212 to another end along a longitudinal direction of the bottom of the housing, and is bent in U-shape at the another end to extend to the outlet pipe 214 along the longitudinal direction of the bottom of the housing. The two set of water paths juxtaposed with each other along the longitudinal direction are formed in the water passage forming body 220, and the openings 218 and 219 extending to the water paths respectively are formed in the water passage forming body 220. The first power module 502 and the second power module 504 are fixed along the paths to the water passage forming body 220. The heat radiating fins projecting from the first and second power modules 502 and 504 into the water paths enable the cooling to be performed efficiently, and a close contact between the metallic water passage forming body 220 and heat radiating surfaces of the first and second power modules 502 and 504 brings about a structure for efficient heat radiation. Further, since the openings 218 and 219 are closed by the heat radiating surfaces of the first and second power modules 502 and 504, the structure is miniaturized and the cooling efficiency is improved.

First drive circuit substrate 602 and second drive circuit substrate 604 are juxtaposed with each other on the first and second power modules 502 and 504 overlaying them respectively. The first drive circuit substrate 602 and second drive circuit substrate 604 form the switching drive circuit substrate 600 shown in FIG. 1.

The first drive circuit substrate 602 arranged above the first power module 502 is slightly smaller than the first power module 502 as seen in a plane face. Similarly, the second drive circuit substrate 604 arranged above the second power module 504 is slightly smaller than the second power module 504 as seen in the plane face.

The inlet pipe 212 and outlet pipe 214 for the coolant water are arranged on a side surface of the housing 210, and a hole 260 are arranged on the side surface to receive therein a connector 282 for the signal. An inside of the housing 210 at which the connector 282 are arranged, a noise cut substrate 560 and a second electric discharge substrate 520 are fixed in the vicinity of the connector 282 for the signal. These are mounted in such a manner that a surface on which the noise cut substrate 560 and the second electric discharge substrate 520 are mounted is parallel to a surface on which the first power module 502, the second power module 504 and so forth are mounted.

A capacitor module 300 including a plurality of the smoothing capacitors is arranged above the plurality of drive circuit substrates 602 and 604, and has a first capacitor module 302 and a second capacitor module 304 each of which is arranged above the first drive circuit substrate 602 and the second drive circuit substrate 604.

A holder plate 320 of flat plate shape is fixed closely to the inner wall surface of the housing 210 at a peripheral area of the holder plate above the first capacitor module 302 and the second capacitor module 304. The holder plate 320 supports the first capacitor module 302 and the second capacitor module 304 on its surface adjacent to the power module and fixedly supports the rotary motor control circuit substrate 700 on its reverse surface. The holder plate 320 is made of metallic material to transmit a heat energy generated by the capacitor modules 302 and 304 and the rotary motor control circuit substrate 700 to be discharged to the housing 210.

As described above, the power module 500, switching drive circuit substrate 600, noise cut substrate 560, second electric discharge substrate 520, capacitor module 300, holder plate 320 and rotary motor control circuit substrate 700 are contained by the housing 210, and an upper opening of the housing 210 is closed by a metallic cover 290.

Further, on the side wall as a front surface on which inlet pipe 212 and outlet pipe 214 for the coolant water of the housing, a terminal box 800 is mounted. The terminal box 800 has a direct current terminal 812 for supplying the direct current electric power from the battery 180, a terminal bracket 810 for the direct current electric power, a terminal 822 for alternating current electric power connected to the first rotary motor 130 and the second rotary motor 140, and a terminal bracket 820 for the alternating current.

The terminal bracket 810 for the direct current electric power is electrically connected to electrodes of the first capacitor module 302 and second capacitor module 304 through bus bars, and the terminal bracket 820 for the alternating current is electrically connected to the plurality of power modules 502 and 504 forming the power module 500 through bus bars.

Incidentally, the terminal box 800 is formed by mounting on its body 840 a bottom plate 844 on which the terminal bracket 810 for the direct current electric power is arranged and a cover 846. This is for making an assembling the terminal box 800 easy.

The power converter 200 has a compact shape as shown in FIG. 5.

<<Each of Members of the Power Converter 200>>

The structure of the power converter 200 as shown in FIGS. 2-7 will be explained in detail as follows. (housing 210)

Figure 8:
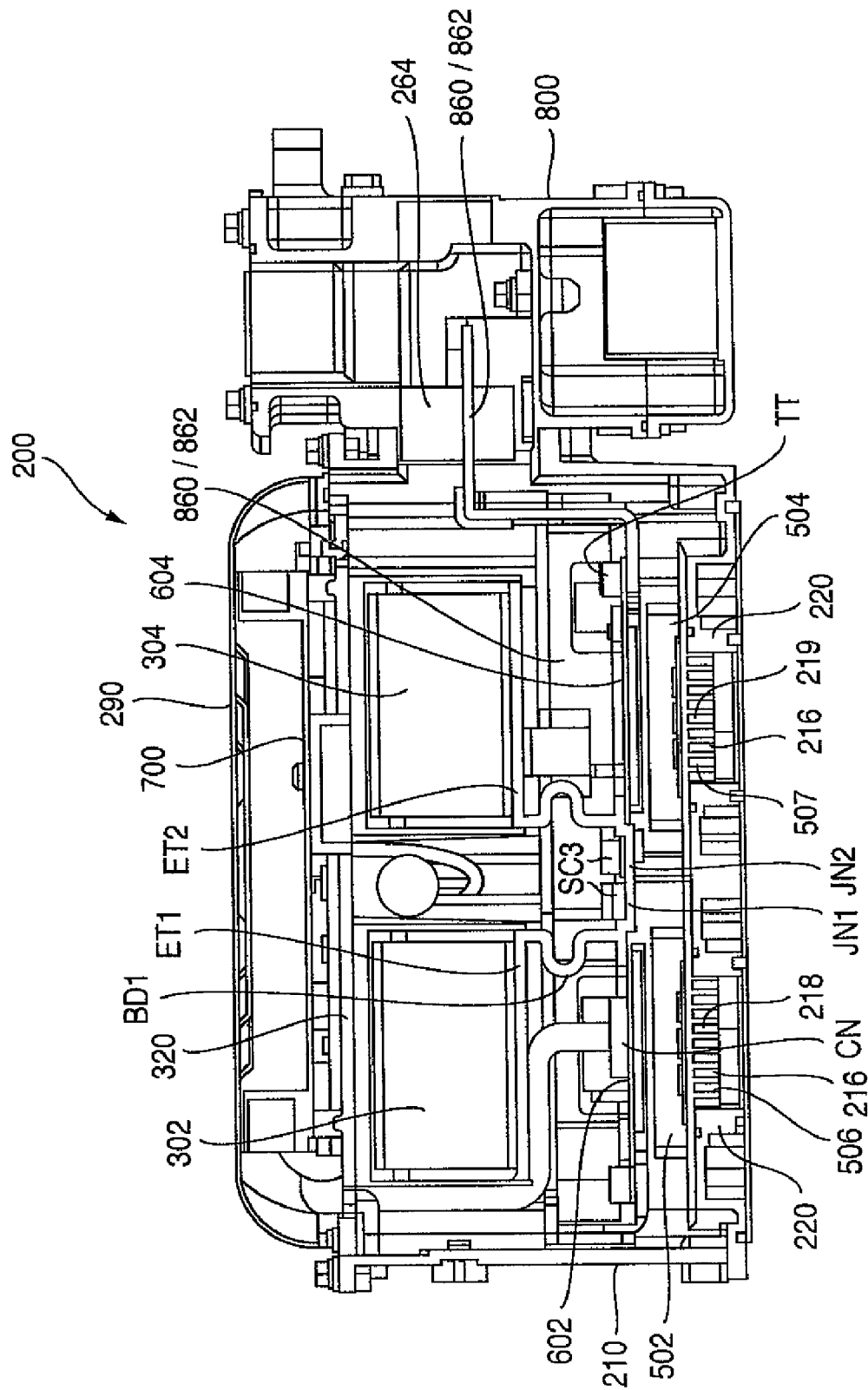
FIG. 8 is a cross sectional view along I-I line in FIG. 5.

In FIG. 8 as a cross section along line I-I in FIG. 5 and the above drawings, the housing 210 is made of a metallic material such as aluminum and has a substantially rectangular box shape. The housing 210 has the water passage forming body 220 including the coolant water path at its bottom, and an opening at its top. The coolant water path at the bottom of the housing 210 is folded back at an area opposite to the inlet and outlet ports so that two parts of the coolant water path are juxtaposed with each other and the coolant water circulates in the coolant water path. The folded back coolant water path has the water passage forming body 220 of dual structure between which a space for allowing the coolant water to flow is arranged at a central area. Openings 218 and 219 are formed along the water path at an upper plate of the water passage forming body 220 as shown in the drawings.

A pair of the first power module 502 and the second power module 504 is arranged at a lower region of the housing 210, and each of the first power module 502 and the second power module 504 is fixed above the water passage forming body 220. The heat radiating surface of each of the first power module 502 and the second power module 504 includes the heat radiating fins 506 and 507 juxtaposed with each other. The heat radiating fins 506 and 507 project from the openings 218 and 219 into the heat radiating fins 506 and 507. Further, the openings are closed by the heat radiating surfaces of the power modules 502 and 504 around the heat radiating fins 506 and 507 to prevent the water leakage so that the sealed water path 216 is formed.

In this structure, the first power module 502 and the second power module 504 are cooled efficiently. Further, since the heat radiating fins 506 and 507 of the first and second power modules 502 and 504 are inserted along the openings 218 and 219 respectively, the first and second power modules 502 and 504 are positioned with respect to the housing.

The housing 210 has a relatively small hole 262 and a relatively great hole 264 of juxtaposed with each other (refer to FIG. 3). The terminal box 800 is arranged on the side wall of the housing 210, the terminal bracket 810 for the direct current electric power I the terminal box 800 is electrically connected to the first capacitor module 302 and the second capacitor module 304 in the housing 210 through the hole 262, and the terminal bracket 820 for the alternating current in the terminal box 800 is electrically connected to the first power module 502 and the second power module 504 in the housing 210 through the bus bars 860 and 862. Parts of the bus bars are shown in FIG. 8.

<Power Module 500 and Stitching Drive Circuit Substrate 600>

Figure 9:
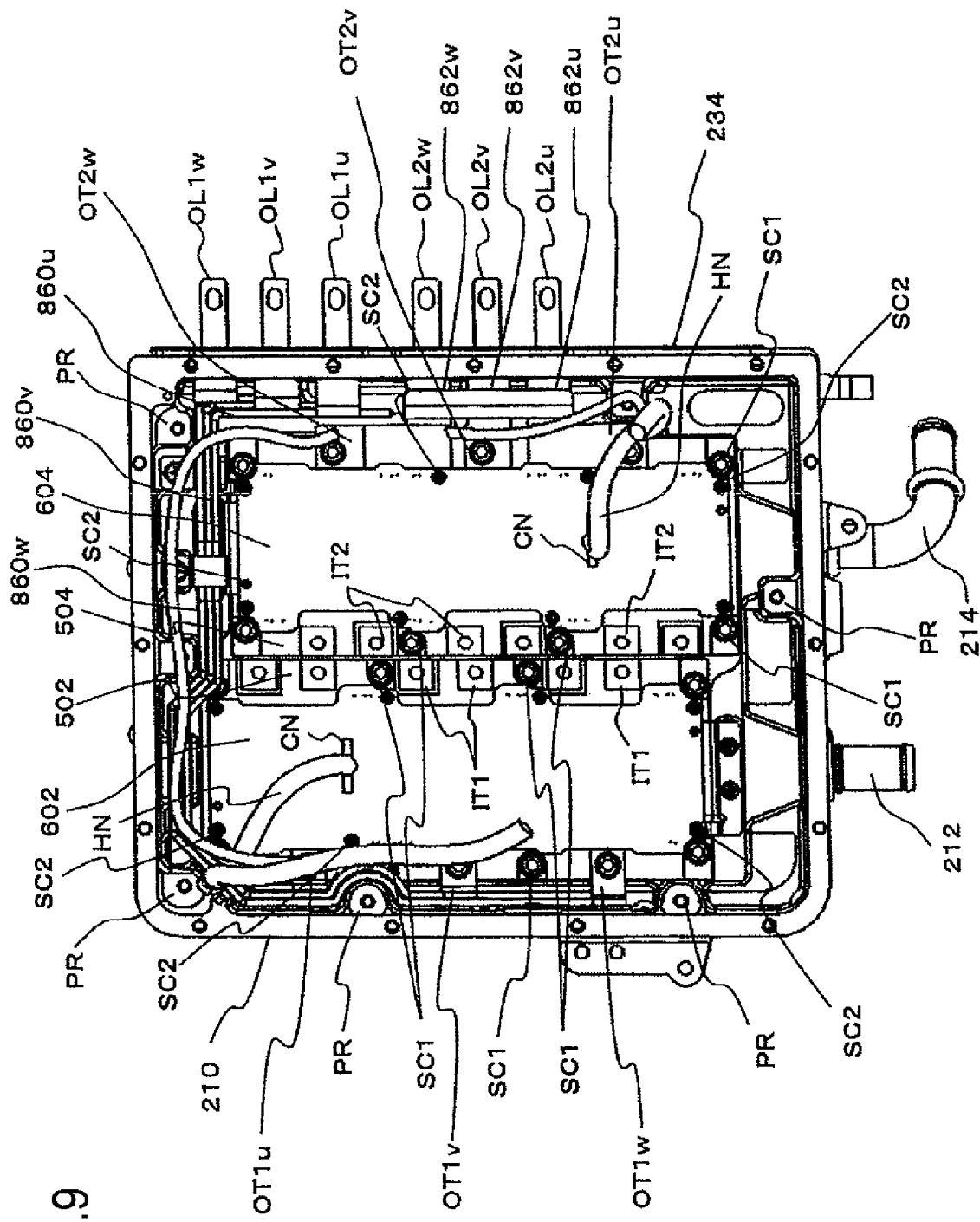
FIG. 9 is a view of the power converter of the invention with a housing in which a power module and a switch drive circuit substrate are arranged.

FIG. 9 is a plan view showing the housing 210 in which the power module 500 and the switching drive circuit substrate 600 are arranged.

The first and second power modules 502 and 504 constituting the power module 500 are arranged between the coolant water path and the rotary motor control substrate 700 and first and second capacitor modules 302 and 304 in the housing. The first and second power modules 502 and 504 are juxtaposed with each other along the coolant water path.

The first power module 502 and the second power module 504 have the geometrically identical structure in which respective direct current terminals IT1 and IT2 and respective alternating current terminals OT1 and OT2 are directed in a common direction, and the first power module 502 and the second power module 504 are arranged symmetrically with respect to a point so that the direct current terminals IT1 and IT2 face to each other at a central position thereof, and the alternating current terminals OT1 and OT2 are arranged to face to the side wall of the housing 210. Since the first power module 502 and the second power module 504 are arranged to make the respective direct current terminals IT1 close to each other and make the respective direct current terminals IT2 close to each other, the first power module 502 and the second power module 504 are shifted with respect to each other along the longitudinal direction.

Since the first power module 502 and the second power module 504 overlap the switching drive circuit substrates 602 and 604 respectively as shown in FIG. 9, the direct current terminals IT1 and IT2 and the alternating current terminals OT1 and OT2 are visible on both narrower sides of the switching drive circuit substrates 602 and 604.

The direct current terminals IT1 and IT2 of the first power module 502 and the second power module 504 are electrically connected to the terminals of the capacitor modules 302 and 304 respectively, and the alternating current terminals OT1 and OT2 of the first power module 502 and the second power module 504 are electrically connected to the alternating current terminal bracket 820 in the terminal box 800.

The alternating current terminal OT1 of the first power module 502 is constituted by terminals OT1$u$, OT1$v$, OT1$w$ corresponding to respective U, V and W phases, and the terminals OT1$u$, OT1$v$, OT1$w$ extend along one of the narrower sides of each of the power modules 502 and 504 to further be connected through the bus bars 860$u$, 860$v$ and 860$w$ extending vertically along the side wall 234 of the housing to lead terminals OL1$u$, OL1$v$ and OL1$w$ projecting from the holes 264 on a main side wall 234 of the housing 210. In this embodiment, the bus bars 860$u$, 860$v$ and 860$w$ extend a side opposite to the inlet and outlet ports of the water path to be bypassed.

The alternating current terminal OT2 of the second power module 504 is constituted by terminals OT2$u$, OT2$v$, OT2$w$ corresponding to respective U, V and W phases, and the terminals OT2$u$, OT2$v$, OT2$w$ are connected through the bus bars 862$u$, 862$v$ and 862$w$ extending vertically along the side wall 234 of the housing to lead terminals OL2$u$, OL2$v$ and OL2$w$ projecting from the holes 264.

The capacitor modules 302 and 304 and rotary motor control circuit substrate 700 are arranged above the power modules 502 and 504 and the switching drive circuit substrate 602 and 604.

The power modules 502 and 504 have screw holes at their peripheries to be fixed to the water path forming body 220 at the lower region of the housing by screws SC1 through the screw holes.

Further, the drive circuit substrates 602 and 604 arranged above the power modules 502 and 504 are fixed to the power modules 502 and 504 by screws 2.

Further, in FIG. 9, the first drive circuit substrate 602 and the second drive circuit substrate 604 supply the switching signals to the first power module 502 and the second power module 504 respectively as described above. Harnesses HN extend from the first drive circuit substrate 602 and the second drive circuit substrate 604 through connectors CN on their main surfaces to be connected to the rotary motor control circuit substrate 700.

<Capacitor Module 300>

Figure 10:
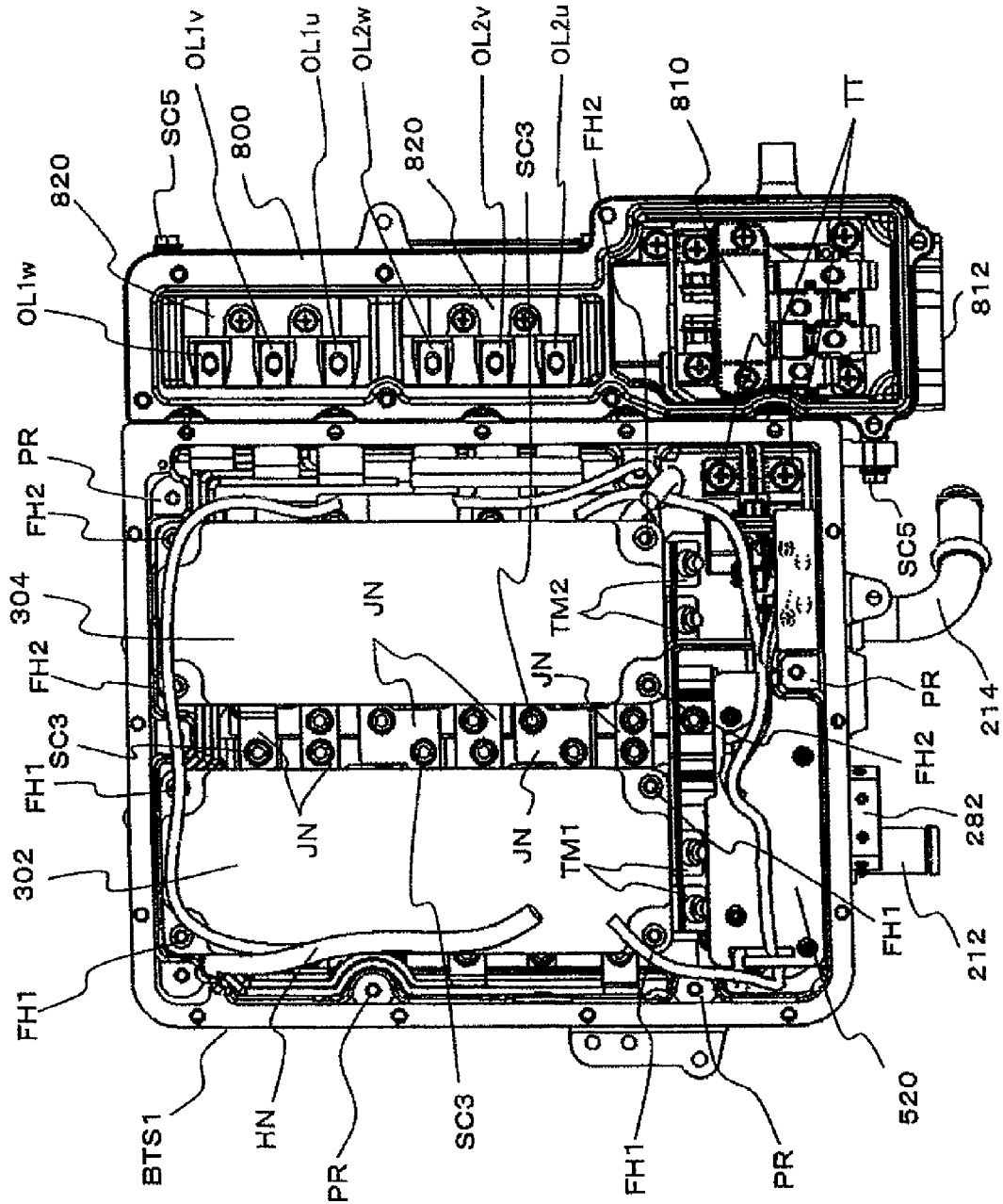
FIG. 10 is a view of the power converter of the invention with the housing in which a capacitor module is arranged.

FIG. 10 is a plan view showing the housing 210 containing therein the capacitor module 300 including the smoothing capacitors.

The capacitor module 300 includes the first capacitor module 302 and the second capacitor module 304 each of which is formed by arranging film capacitors (capacitor cells) of, for example, 5 or 6 in a rectangular case made of, for example a resin material.

As shown in FIGS. 8 and 10, the first capacitor module 302 and the second capacitor module 304 are juxtaposed with each other so that the first capacitor module 302 is arranged above the first drive circuit substrate 602 and the second capacitor module 304 is arranged above the second drive circuit substrate 604.

The first capacitor module 302 and the second capacitor module 304 are electrically connected to the direct current terminals of the first and second power modules 502 and 504 through connection parts JN (including JN1 and JN2).

Incidentally, the first capacitor module 302 and the second capacitor module 304 are electrically connected to a pair of the direct current terminals of U phase arm, a pair of the direct current terminals of V phase arm and a pair of the direct current terminals of W phase arm in the power module 500. Therefore, each of the first power module 502 and the second power module 504 are connected to corresponding one of the first capacitor module 302 and the second capacitor module 304 at 6 positions as shown in FIG. 10. By this arrangement, inductances between the capacitor modules and the power modules are decreased. The decrease in inductances causes an effect of that a temporary increase in voltage by the switching operation of the power modules is restrained.

In FIG. 10, each of the first and second capacitor modules 302 and 304 has a pair of the electrodes TM1 and TM2 connected to the terminal bracket 810 for direct current to be connected to an outer direct current electric power source through the electrodes. The electrodes TM1 and TM2 of each of the first and second capacitor modules 302 and 304 are arranged a side of the housing 210 adjacent to the inlet and outlet ports of the water path. Since they are arranged in the common side in which the terminal bracket 810 for the direct current electric power is arranged in the terminal box 800, they are easily connected electrically to the high voltage battery as the outer direct current electric power source to improve the operability.

In FIG. 10, each of the first and second capacitor modules 302 and 304 has at its four corners fixing holes FH1 and FH2 in which nuts are embedded respectively so that the first and second capacitor modules 302 and 304 are fixed to the holder plate 320 by screws SC4 (refer to FIG. 11) screwed into the fixing holes FH1 and FH2 through holes of the holder plate 320 corresponding to the fixing holes FH1 and FH2. That is, the first and second capacitor modules 302 and 304 are fixed to the holder plate 320 in a suspended manner.

<Holder Plate 320>

Figure 11:
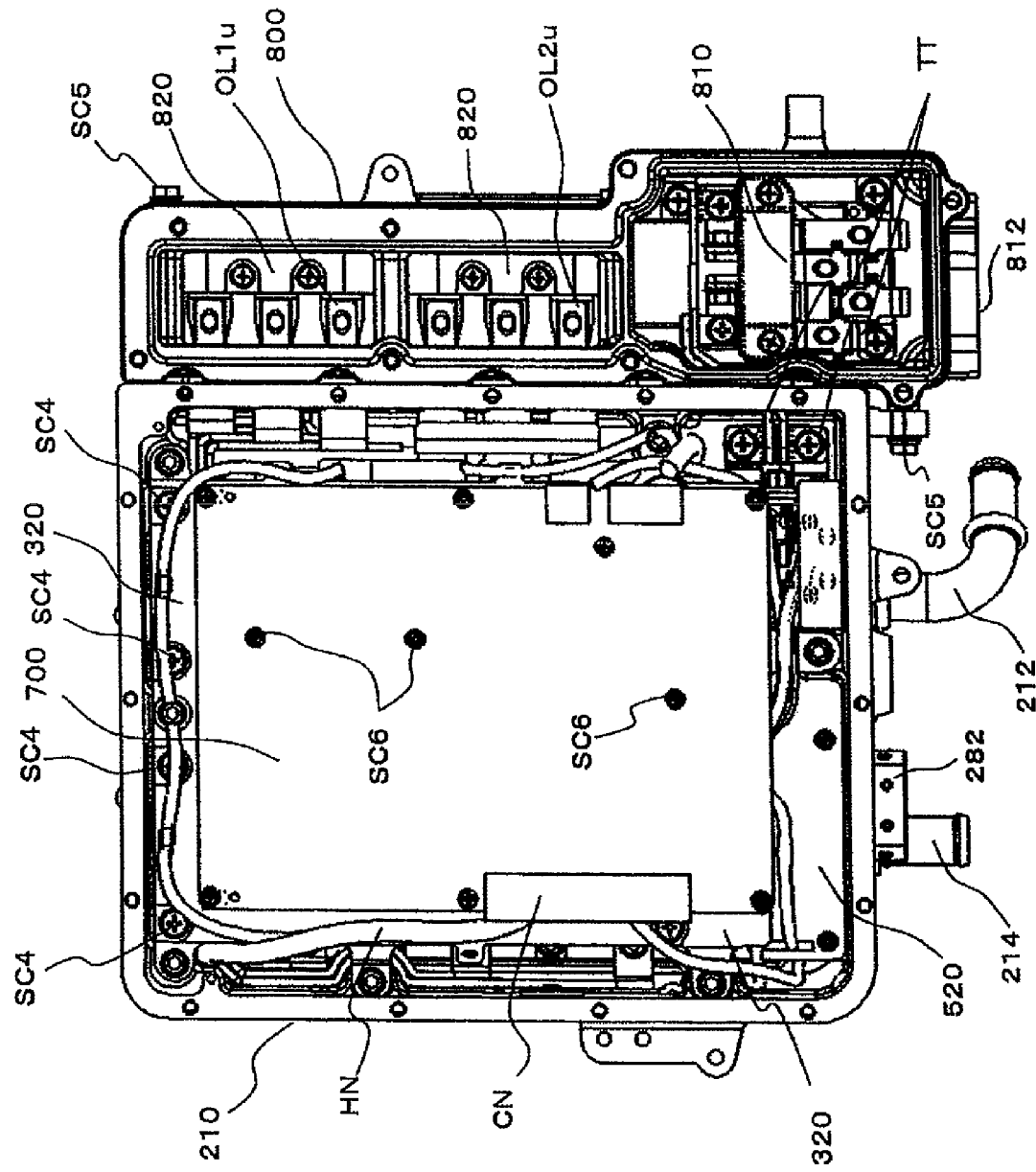
FIG. 11 is a view of the power converter of the invention with the housing in which a rotary motor control circuit substrate is arranged.

FIG. 11 is a plan view showing the housing 210 containing therein the holder plate 320 having thereon the rotary motor control circuit substrate 700. The holder plate 320 as a control substrate bracket having the rotary motor control circuit substrate 700 is fixed to the housing 210 above the capacitor module 300 in the housing 210.

A plurality of protrusions PR (refer to FIGS. 9 and 10) are arranged in a circumferential direction of the inner surface of the housing at a substantially fixed interval so that upper end surfaces of the protrusions PR support the holder plate 320 at its periphery, and the holder plate 320 is fixed by screws SC4 screwed into the upper end surfaces of the protrusions PR through screw holes formed at the periphery of the holder plate 320. Since the holder plate is supported by a great area of the upper end surfaces of the protrusions arranged circumferentially, a high thermal conductivity between the housing and the holder plate is obtained. The holder plate 320 is made of a metallic material of high thermal conductivity such as aluminum material similarly to the housing 210 to improve a mechanical strength. Further, a surface on which the rotary motor control circuit substrate 700 is mounted has a pattern of concavity and convexity.

The convexity of the holder plate 320 is formed to face to a surface area of the rotary motor control circuit substrate 700 on which electric wires or the like are formed so that the electric wires or the like are prevented from contacting the holder plate 320 of metallic material to prevent an electric short of the electric wires or the like. Further, the convexity as a recess is formed at a connection area for the direct current electric power source.

The convexity on a surface of the holder plate facing to the rotary motor control circuit substrate 700 includes bosses BS distant from each other as shown in FIG. 3 so that the rotary motor control circuit substrate 700 is fixed to the holder plate 320 by screws SC6 (refer to FIG. 16) screwed into the bosses through screw holes formed on the rotary motor control circuit substrate 700.

As described above, the holder plate 320 holds fixedly the first capacitor module 302 and the second capacitor module 304 below it by screws SC4 screwed into the fixing holes FH1 and FH2 at the four corners of each of the first capacitor module 302 and the second capacitor module 304 through the screw holes of the holder plate 320.

Accordingly, since the first capacitor module 302 and the second capacitor module 304 are fixed to the holder plate 320 contacting the housing 210, a thermal energy generated by the first capacitor module 302 and the second capacitor module 304 is easily transferred t the housing 210 through the holder plate 320 to improve a heat radiating effect. Further, since the housing is cooled by the coolant water path, temperatures of the first capacitor module 302 and the second capacitor module 304 are restrained from increasing.

<Rotary Motor Control Circuit Substrate 700>

FIG. 11 is a plan view showing the housing 210 containing therein the rotary motor control circuit substrate 700 on the holder plate 320.

The rotary motor control circuit substrate 700 includes electric parts for small signal as well as the connector CN. The connector CN is connected through the harness HN to, for example, the connector CN mounted on the switching drive circuit substrates 602 and 604.

The rotary motor control circuit substrate 700 has screw holes at its peripheral four corners and central area other than the parts and wiring layer connecting the parts to be fixed to the holder plate 320 by screws SC6 screwed into the holder plate 320 through the screw holes.

Therefore, the rotary motor control circuit substrate 700 can be restrained from being deformed at its central area by vibration or the like, in comparison with a case in which only its peripheral area is fixed to the frame.

As describe above, since the rotary motor control circuit substrate 700 is mounted on the holder plate 320 contacting the housing 210, the heat energy generated by the rotary motor control circuit substrate 700 is efficiently transferred to the housing 210 through the holder plate 320 to improve the heat radiating effect.

<Cover 290>

The cover 290 close the opening of the housing 210 after the first and second power modules 502 and 504, switching drive circuit substrates 602 and 604, first and second capacitor modules 302 and 304, holder plate 320 and rotary motor control circuit substrate 700 are received in the housing 210.

The cover 290 is made of a material similar to that of the housing 210, and is fixed to the housing 210 (refer to FIG. 5) by screws SC7 screwed into the upper end surfaces of the housing 210 through screw holes arranged circumferentially at the substantially constant interval on its periphery.

<Cooling Structure of First and Second Power Modules 502 and 504>

Figure 12:
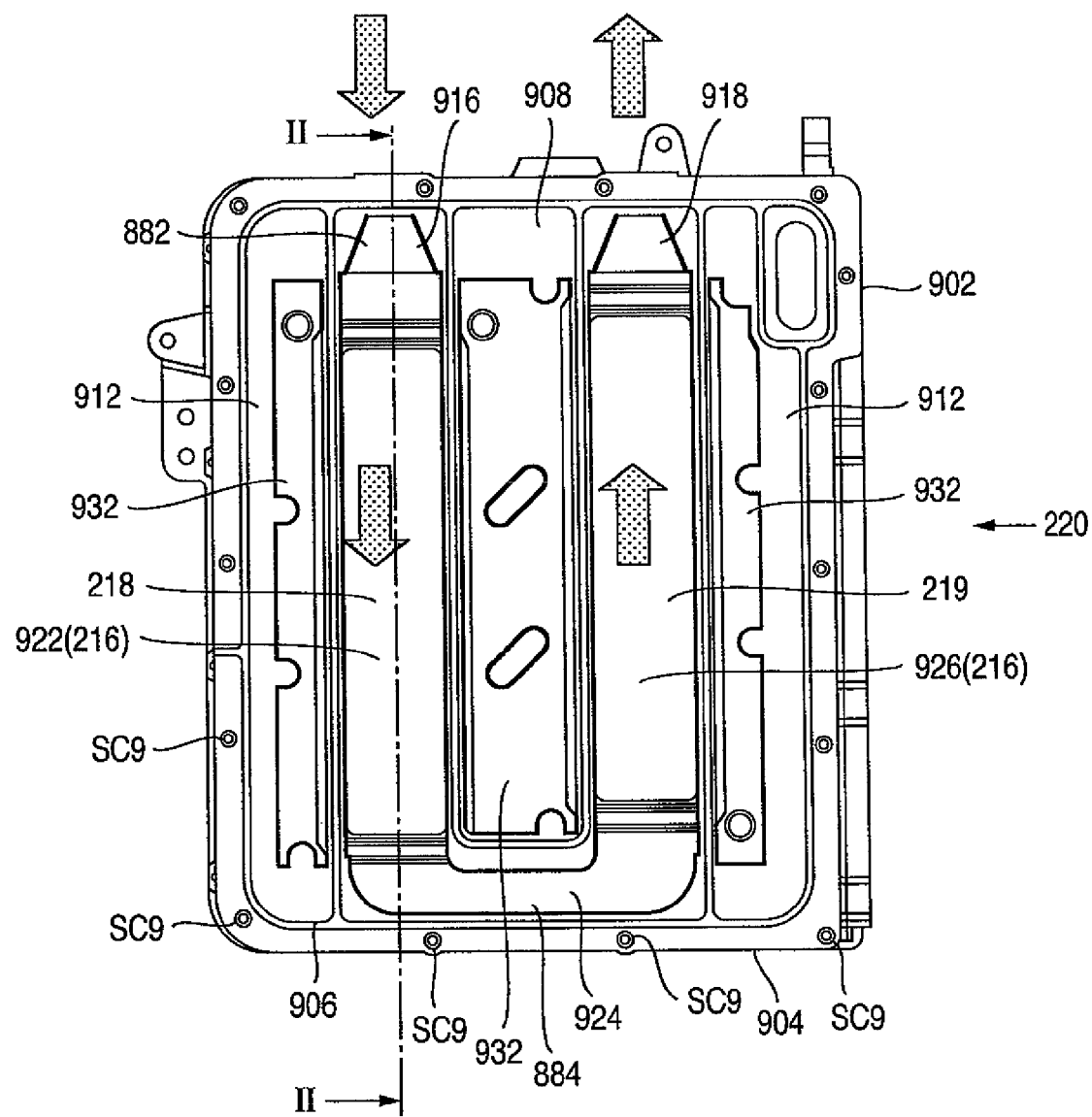
FIG. 12 is a view of the power converter of the invention with the housing from which a cover of a water path forming body is detached, as seen upward from a bottom side.

As described above, the coolant water path is formed at the bottom of the power converter 200. FIG. 12 is a structural view seen upward from the bottom of the housing 210 to show a water path holder member 902 as a part of the water path forming body 220. The water path holder member 902 has an outer peripheral part 904 on which a bottom plate as another part of the water path forming body 220 is mounted, and the outer peripheral part 904 includes holes SC9 for screw fixing. Some of them have denoting numbers, and the other of them have no denoting number. A seal groove 906 is arranged at an inner side of the outer peripheral part 904 to prevent the water leakage, and the water path holder member 902 at the inner side of the seal groove 906 has outer regions 912 at its both sides, as well as the first and second water paths 922 and 924 and central area 908 referred to as the coolant water path 216 in the previous drawing. An O-ring or rubber seal is fitted into the seal groove and the screw holes) are tightened by the screws to obtain the seal function. The coolant water is supplied to an inlet part 916 of the water path 922 (previously referred to as 216), the coolant water flows through the first water path 922 in a direction of arrow, a flow direction of the coolant water is changed in U-shape by a fold back path 924 to flow through the second water path in the direction of arrow, and the flow is discharged from a discharge port 918 of the water path 924. The first and second water paths 922 and 924 have openings 218 and 219 as holes. By attaching the bottom plate 934 in FIG. 13 as described below, the water paths 922 and 924 are formed and the openings 218 and 219 open to the water paths.

The central part 908 between the first water path 922 and the second water path 926 and the outer region 912 between the first water path 922 and the outer peripheral part 904 and between the second water path 926 and the outer peripheral part 904 have recesses 932 to decrease a thickness of molded aluminum.

Figure 13A:
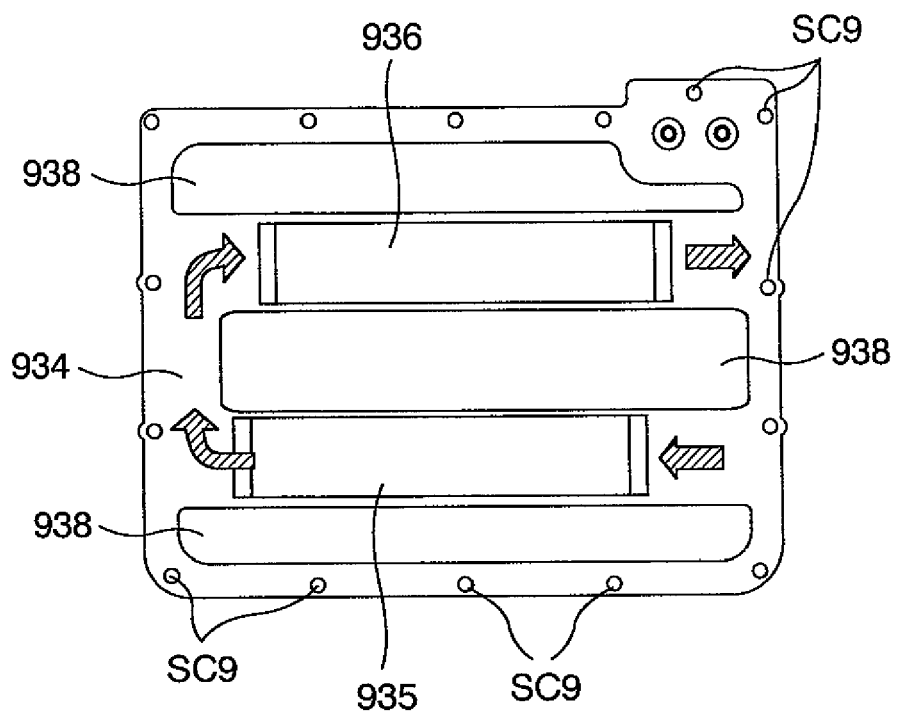
FIG. 13A is a front view showing the cover of the water path forming body.

In FIGS. 13(A) and (B), the bottom plate 934 closing the bottom of the housing 210 shown in FIG. 12 is shown. The bottom plate 934 and the are water path forming members to allow the water to flow as shown by the arrow in FIG. 13(A). The bottom plate 934 has the screw holes SC9 to be pressed by screws through the screw holes SC9 at the outer periphery 904 of the water path holder member 902. The bottom plate 934 has first protrusion 935 and second protrusion 936 so that the protrusion 935 is inserted into the water path 922 and the protrusion 936 is inserted into the water path 926. Incidentally, a recess is formed to decrease the thickness of molded aluminum.

Figure 13B:
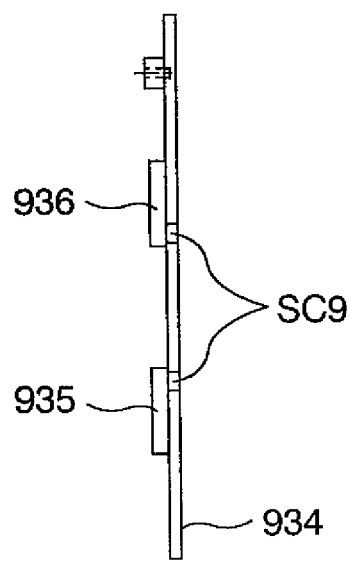
FIG. 13B is a side view of the cover.
Figure 14:
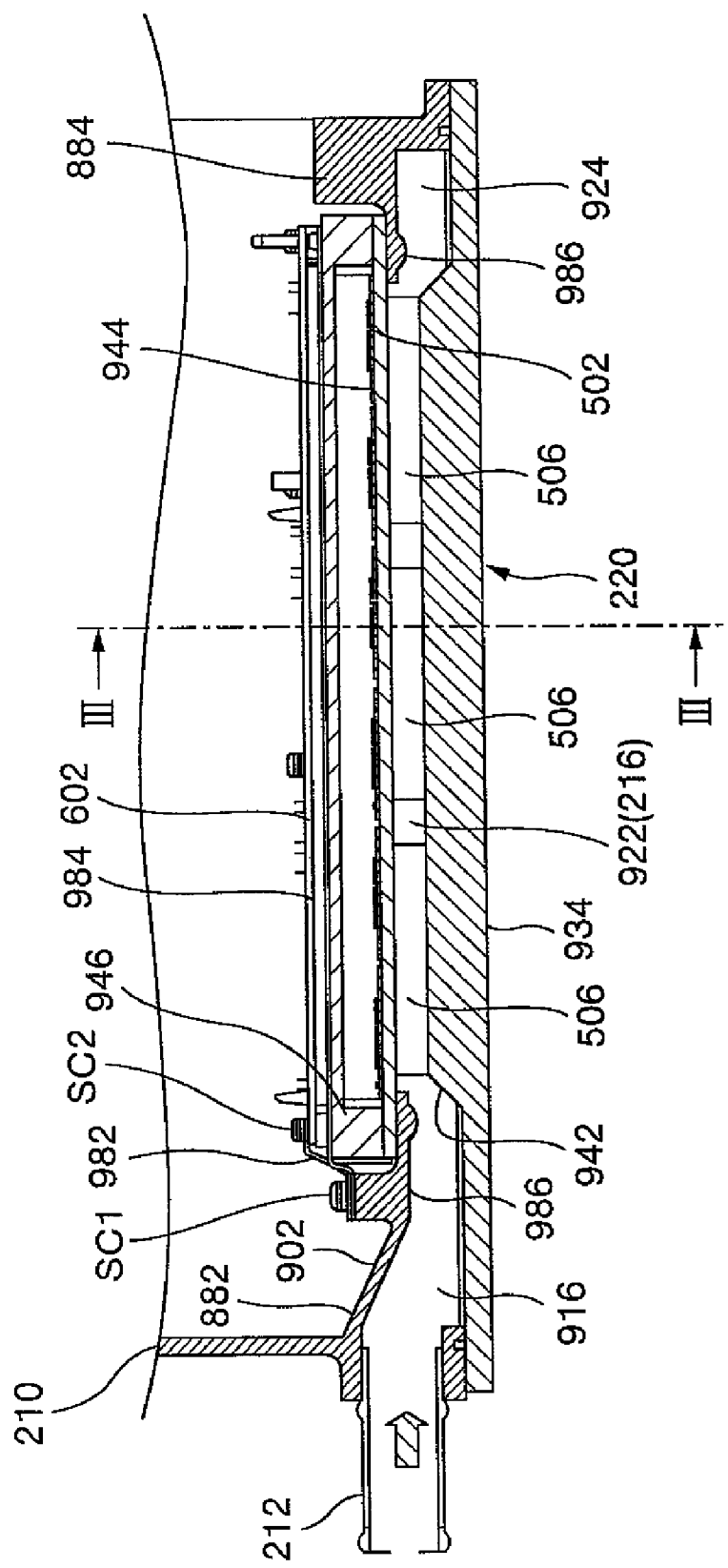
FIG. 14 is a cross sectional view along II-II line in FIG. 12.

A cross section of the water path 922 along II-II section in FIG. 12 is shown in FIG. 14. Incidentally, the water path 926 has the substantially same shape. in FIGS. 12, 13 and 14, the water path holder member 902 includes water paths 922 and 924 parallel to each other. The coolant water is introduced from the inlet pipe 212 (not shown in FIG. 12) into an inlet part 916. The inlet part 916 of the water path includes a metallic roof 882 monolithically formed with the housing 210, and metallic side walls 988 and 990 monolithically formed with the housing 210 are arranged at both sides of the water path. A width of the water path increases gradually and a depth thereof decreases gradually at a downstream side of the inlet pipe as shown in FIG. 12. Therefore, the flow of the coolant water is made smooth to restrain bubbles from being generated and to decrease a flow resistance. The water is introduced from the inlet part into the water path with the opening. The water path with the opening has a protrusion 935 at its bottom as shown in FIG. 13 so that the bottom of the water path is elevated and the depth of the water path is slightly deeper than a height of the heat radiating fin. The height of the heat radiating fin is 6-8 mm, and the depth of the water path is not more than 10 mm, preferably not more than 9 mm.

The opening 218 is formed on a side of the water passage forming body 220 opposite to the protrusion 935, and the heat radiating fin 506 on the base plate 944 of the power module 502 projects into he opening 218 while the power module 502 is fixed by the screws SC1. Although not shown in the drawings, the power module 504 is fixed onto the opening of the water passage forming body 220 in which the other water path 926 is formed. Accordingly, a thermal conductivity between the heat radiating fin and the water as the coolant is improved. Further, the fold back portion as a joint between the water paths 922 and 926 juxtaposed with each other has a depth deeper than that of the region in which the fin projects to decrease the flow resistance to facilitate the coolant flow.

The power module 504 has the substantially same structure as the power module 502 as described below, and is fixed similarly, whereby only the power module 502 is explained. The plurality of the heat radiating fins 506 (three heat radiating fins in this embodiment) project into the water path from the opening 218 of the water path 922. The heat radiating fins 506 are arranged on one of the surfaces of the metallic base plate 944, and the semiconductor chips are mounted on the other one of the surfaces of the metallic base plate 944. The semiconductor chips are sealed by a resin case 946. Such structure is common with a relationship between the power module 504 and the water path 926.

The power module 502 is fixed with the metallic plate 982 by the screws SC1 to the water path forming body forming the water path as shown in FIGS. 9 and 14. in this embodiment, it is fixed to the water path cover 882 formed monolithically with the housing 210. The power module 502 fixed by the screws closes at its heat radiating surface the opening 218 of the water path 922. A sealing member such as O-ring 986 is arranged between the heat radiating surface of the power module 502 and the water path forming body around the opening to prevent the water leakage.

A heat radiating plate 984 of metallic or resin material of high thermal conductivity is arranged to opposite to the metallic plate 982, and the drive circuit substrate 602 is arranged to opposite to the heat radiating plate 984. The thermal energy of the drive circuit substrate 602 is transmitted to the water path forming body through the heat radiating plate 984 to be transmitted to the coolant water so that a temperature of the drive circuit substrate 602 is restrained from increasing. The above structure and functional effect are also obtainable in the power module 504 and the drive circuit substrate 604.

Figure 15:
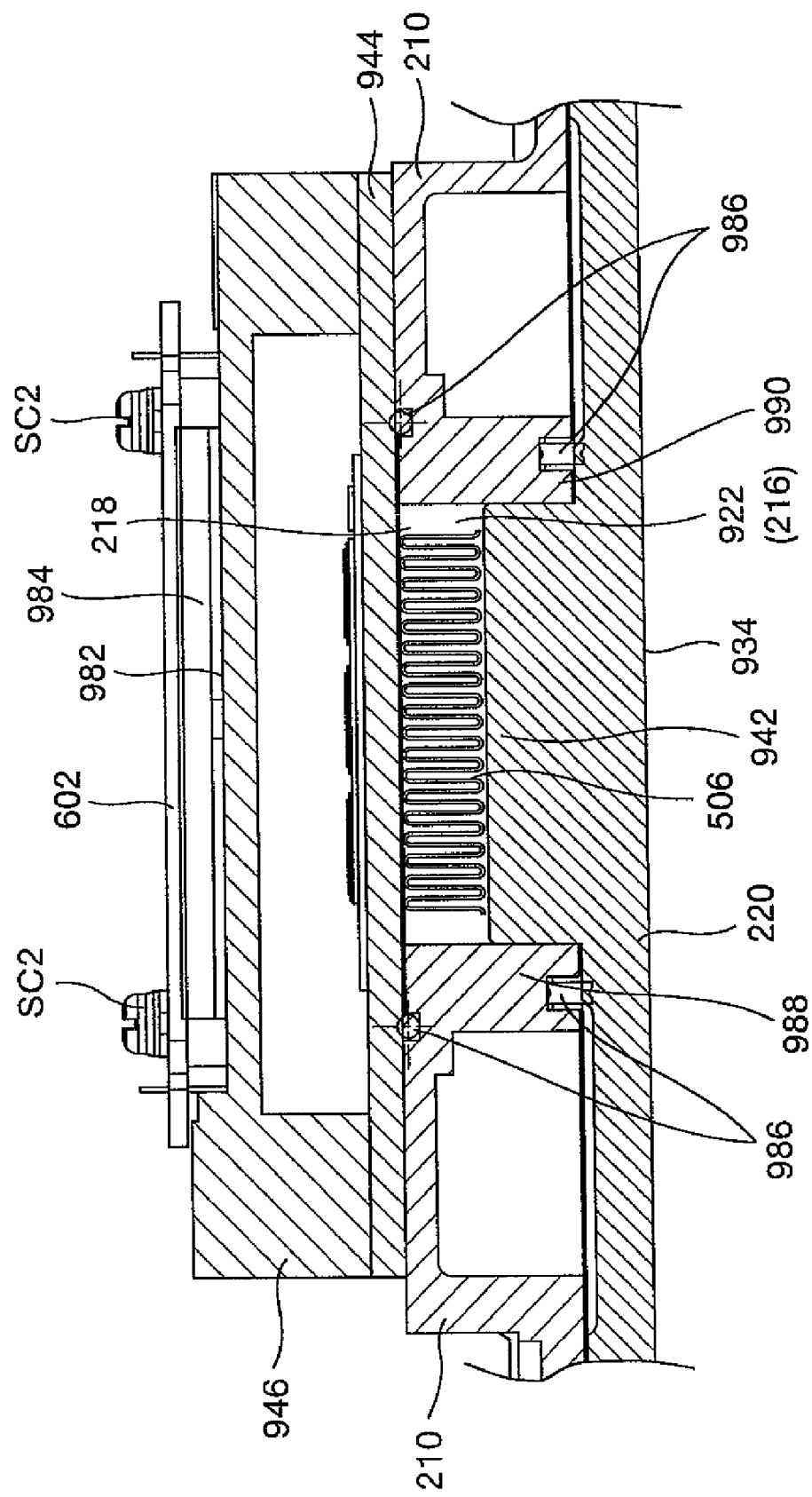
FIG. 15 is a cross sectional view along III-III line in FIG. 14.

FIG. 15 is an enlarged partial view along section of FIG. 14. The bottom plate 934 is arranged at the bottom of the water path forming body 220 to form the water path 922. Both sides of the water path are defined by side plates 988 and 990 monolithically formed with the housing 210. A sealing between the side plates 988 and 990 and the water path forming body 220 is performed by a sealing member 986 such as O-ring or gasket whose width is greater than the O-ring. The opening 218 above the water path 922 is closed by the heat radiating surface of the metallic base plate 944 of the power module 502 as described above. The sealing member 986 such as O-ring or gasket whose width is greater than the O-RING is used for the sealing. The plurality of the semiconductor chips are fixed to the other surface of the metallic base plate 944 and sealed by the resin case 946.

The drive circuit substrate 602 is fixed by the screws SC2 onto the power module 502 through the heat radiating plates 982 and 984.

In the above description, as shown in FIG. 14, the water path is made deep at the inlet, outlet and fold back portions, and the region in which the heat radiating fin is inserted is made shallow in comparison with the above portions. The depth of the water path at the region in which the heat radiating fin is inserted is slightly greater than the height of the heat radiating fin. In this embodiment, the height of the heat radiating fin is 6-8 mm. the depth of the water path is not more than 10 mm, preferably not more than 9 mm. The above structure and functional effect is also obtainable in the power module 504 and the water path forming body including the water path.

<Power Module>

Figure 16:
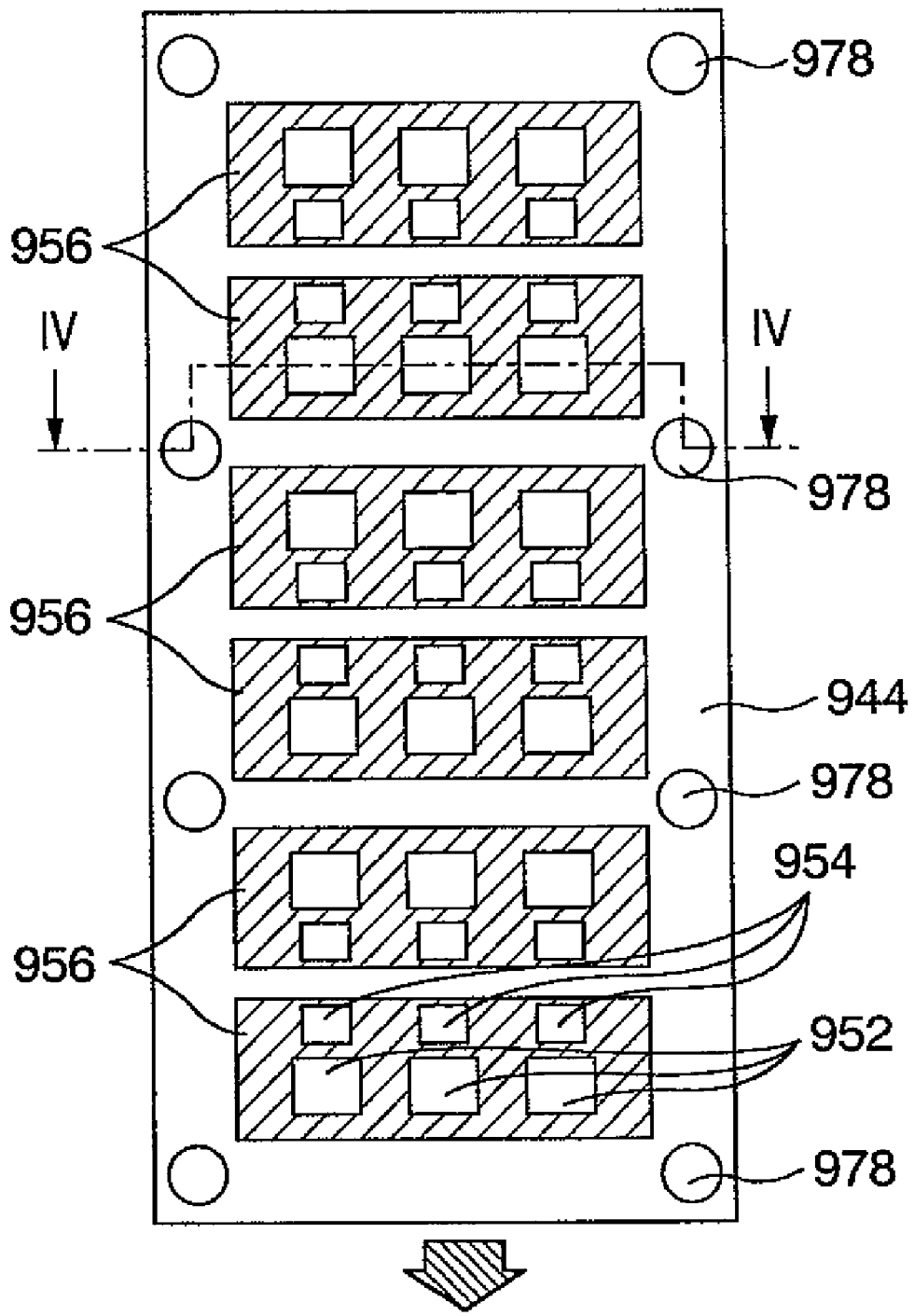
FIG. 16 is a view of the power module of the invention from which a resin cover is detached.
Figure 17:
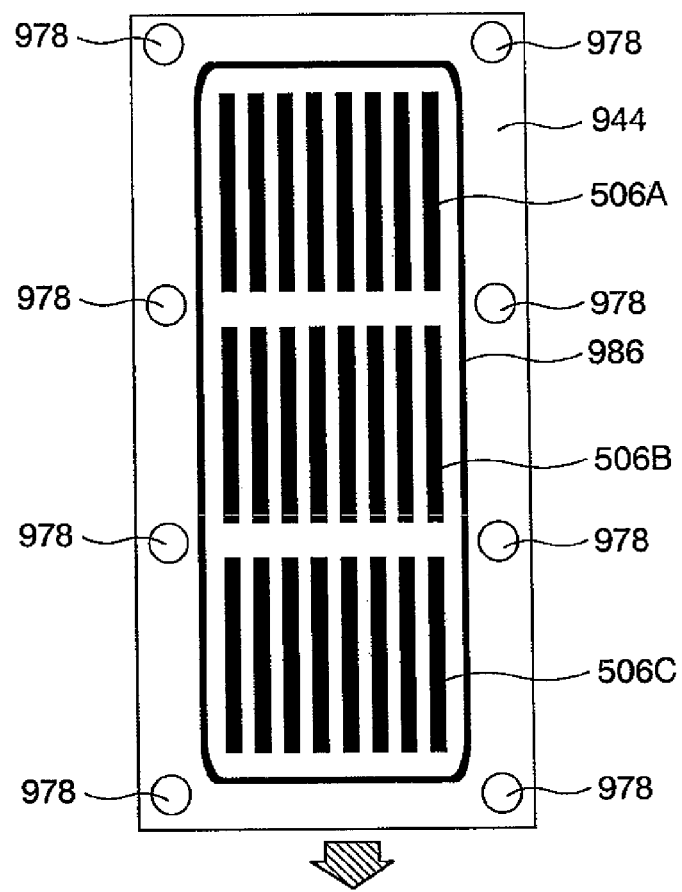
FIG. 17 is a view of the power module of the invention as seen from the fin.
Figure 18:
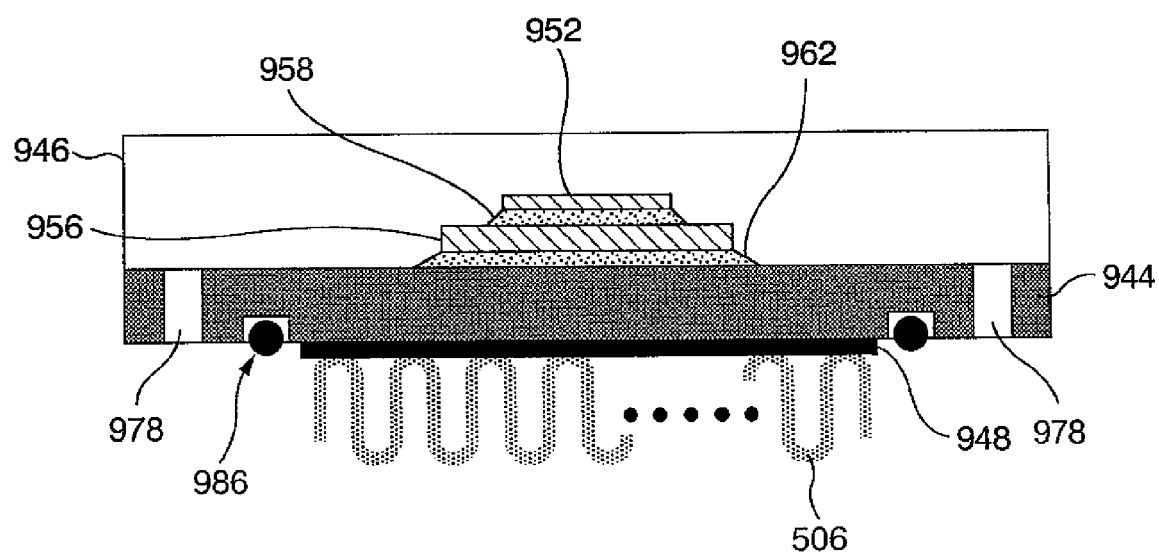
FIG. 18 is a cross sectional view along IV-IV line in FIG. 16.

The power module 5-2 or 504 as seen from the fin side is shown in FIG. 17, and the power module 5-2 or 504 from which the resin case is removed is shown in FIG. 16. Further, a IV-IV cross section in FIG. 16 is shown in FIG. 18. Although three cross sections of the semiconductors are shown actual cross sectional view, for intelligible explanation, two of the semiconductor chips are deleted, and one of the semiconductor chips as being enlarged is shown.

Three sets of the heat radiating fins 506A, 506B and 506C are mounted on the heat radiating surface of the metallic base plate as shown in FIG. 17. The O-ring or gasket as the seal member 986 for preventing the leakage of the coolant water from the water path is arranged on the heat radiating surface around the outer periphery of the heat radiating fin. The openings of the water path 922 (216) and 926 (216) are closed by the base plate 944 whose heat radiating surface is pressed against the openings of the water path by the screws, and the seal member 986 prevents the leakage of the coolant water from the water path.

The heat radiating fin is fixed by a brazing material 948 as shown in FIG. 18. The brazing is carried out in, for example, 600-700° C. The insulating substrate 956 is adhered by a second solder layer 962 to the reverse surface of the metallic base plate 944 to opposite to the three sets of the heat radiating fins.

The metallic base plate 944 is an alloy including a main component of copper and impurities. It preferably has a hardness not less than HV50 after the heat radiating fin is fixed by the brazing and a thermal conductivity not less than 200 W/mK. A thickness of the base plate is 2-4 mm. The flatness at a part thereof overlapping the insulating substrate or surrounded by the fixing screw holes 978 is preferably not more than 0.2 mm or is not more than 0.1 mm as optimum value. Further, the flatness at the other part thereof overlapping the six insulating substrates or the semiconductor chips forming the inverter is preferably not more than 0.4 mm or is not more than 0.3 mm as optimum value. When the copper includes the impurity harder than the copper, the hardness thereof increases in accordance with an increase in rate thereof. On the other hand, since the impurities are of lower thermal conductivity than copper, the thermal conductivity as the whole decreases. Therefore, it is preferable for the rate of the impurities to be adjusted to maintain the hardness and the thermal conductivity. Further, it is preferable for the base plate to be plated with nickel of thickness of about 3-9 μm. As shown in FIG. 18, the heat radiating fin 506 is attached to one of surfaces thereof by brazing and the insulating substrate of the semiconductor chips is attached to the other one of surfaces thereof by soldering. There is a probability of that the surface of cupper includes scratch, whereby the plating of suitable thickness enables the surface roughness to be kept suitable. In this embodiment, it is preferable for the region where at least the insulating substrate is mounted and the O-ring is arranged to have the surface roughness for satisfying Ra=3.2.

<Production of Semiconductor Module>

In FIG. 18, the metallic heat radiating fin 506 is attached by brazing in 600-700° C. to the base plate of alloy with the main component of copper satisfying the above condition. In a certain case, it becomes 800-900° C. If the base plate 944 is soft, the flatness is deteriorated by the brazing to make the subsequent adhesion of the insulating substrate difficult. The containing rate of the impurities is adjusted appropriately to have the hardness not less than HV50 and the thermal conductivity not less than 200 W/m after the brazing. As shown in FIG. 16, the three fins 506A-C are fixed by the brazing.

In another process, the semiconductor chips 952 are adhered to the insulating substrate 956 by high melting point solder. A first solder layer 958 is formed by this process to fix the semiconductor chips 952 to the insulating substrate. The solder layer is a layer of the high melting point solder, and is not melted during an adhesion process with a second solder layer of low melting point solder. As shown in FIG. 16, three sets of diode chips 954 and three sets of IGBP chips 952 are adhered to the insulating substrate 956. The denoting codes are attached only to the insulating substrate 956, and those for the other insulating substrate are not shown. The insulating substrates each including the three sets of diode chips 954 and the three sets of IGBP chips 952 are arranged in parallel to face to each other to correspond to one of U, V and W phases and one of the fins adhered to the reverse surface of the base plate 944. The base plate 944 shown in FIG. 16 includes the three insulating substrates arranged in parallel to face to each other to form the inverter for three phases. The insulating substrates have the identical structure.

After the above process, the insulating substrates of six to each of which the semiconductor chips 952 of three sets are adhered are adhered by the second solder 962 of low melting point to the base plates 944 including the heat radiating fins of three to have a positional relationship thereamong as shown in FIGS. 16 and 17. That is, they are attached in such a manner that the insulating substrates of two opposite to the fin of one through the base plate 944. In FIG. 18, the heat radiating fin 506 and the base plate 944 are adhered to each other by the brazing at the highest adhering temperature. The semiconductor chips 952 are adhered to the insulating substrate 956 by the high melting point solder at a second temperature lower than the highest adhering temperature. The insulating substrate 956 is adhered to the base plate by the low melting point solder at a temperature lower than the second temperature. Since the highest adhering temperature for adhering the heat radiating fin 506 by the brazing is high, if the base plate 944 is not formed of the metallic material harder than the pure copper, the flatness of the reverse surface of the base plate 944 is deteriorated to make the adhesion of the insulating substrate difficult. If the content of the metallic impurity is increased, the flatness can be easily kept, but the thermal conductivity decreases to decrease the cooling efficiency of the insulating substrate 956. A condition for obtaining both of the characteristics is that the hardness after the brazing is not less than HV 50, and the thermal conductivity after the brazing is not less than 200 W/mK. Further, it is optimum that the flatness in the region of each of the insulating substrates is not more than 0.1 mm, and it is preferable that the flatness is not more than 0.2 mm. Further, it is desired that the area of the base plate to which the insulating substrates of six are adhered is kept high in flatness, it is optimum that the area (to which all of the insulating substrates are adhered) to which the insulating substrates of six are adhered has the flatness not more than 0.3 mm, and it is preferable that the flatness is not more than 0.4 mm close to 0.3 mm.

In another concept, it is optimum that an area defined by the attaching screws 978 has the flatness not more than 0.1 mm, and it is preferable the flatness is not more than 0.2 mm.

In this embodiment, the plurality of the insulating substrates 956 are arranged on the base plate 944, and an arrangement for bearing high voltage on each of the semiconductor chips in each of the insulating substrates is kept. Accordingly, for example, in the insulating substrate including the plurality of the semiconductor chips for converting the direct current electric power of voltage not less than 300 V to the alternating current electric power, an area of the insulating substrate is great, it is preferable that the flatness in the area to which each of the insulating substrates 956 is adhered is not more than 0.2 mm, and it is optimum that the flatness is kept not more than 0.1 mm.

As shown in FIG. 16, the semiconductor chips of three sets adhered to the insulating substrate are, in this embodiment, IGBT (Insulated Gate Bipolar Transistor) chips and diode chips, and chips 952 in FIG. 18 are IGBT chips. The diode chips 954 adjacent to the IGBT chips have the structure as shown in FIG. 18, and are adhered to the insulating substrate 956 by the same process. A difference is that the diode chips are used as the semiconductor chips. The IGBT chips of three and the diode chips of three are adhered to each of the insulating substrates by the high melting temperature solder, and the insulating substrate of six each including these semiconductor chips of six are adhered to the base plate 944 with an arrangement shown in FIG. 18 by the low melting point solder.

In the above embodiment, the IGBT chips are used as the semiconductor chips 952, but MOS transistor chips may be used. In this case, the diode chips do not need to be used.

In FIGS. 16, 17 and 18, holes 978 are used to attach the semiconductor module to the path forming body 220.

Figure 19:
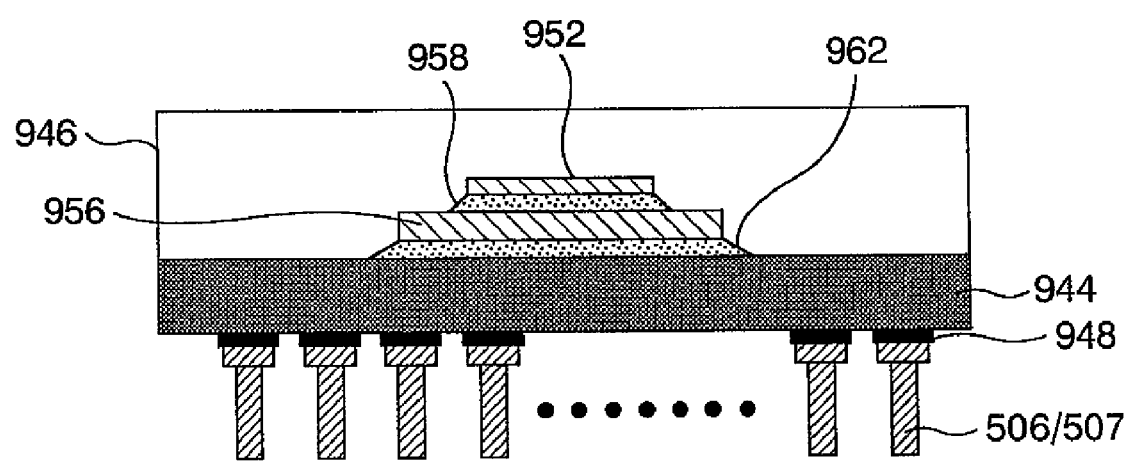
FIG. 19 is a cross sectional view of another embodiment of the invention of FIG. 18.

FIG. 19 wherein the heat radiating fin 506 has a pin shape is an embodiment other than that of FIG. 18. It is attached to the base plate 944 by the brazing similarly to the radiating fin 506 of wave shape shown in FIG. 18. The fin of pin shape is adhered to the metallic base plate by the brazing material layer 948. In this embodiment, a height of the pin as the heat radiating fin from the base surface is 6-8 mm. The depth of the water path at the area in which the heat radiating fin is inserted as shown in FIG. 14 is not more than 10 mm, preferably not more than 9 mm. A number of the pins in each area of the pins, that is, the area 506A in FIG. 17, is 300-700. A diameter of the pins is 3-5 mm with a height of 0.5-1.5 mm at the brazed portion, a diameter of its higher part is 2-3 mm. These pins are arranged in a staggered form.

Figure 20B:
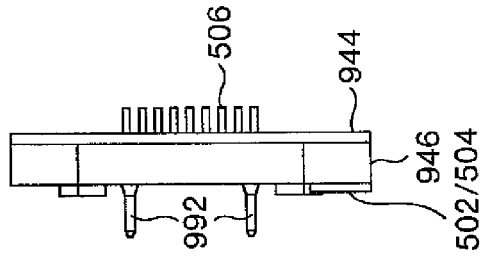
FIG. 20B is a side view thereof.
Figure 20A:
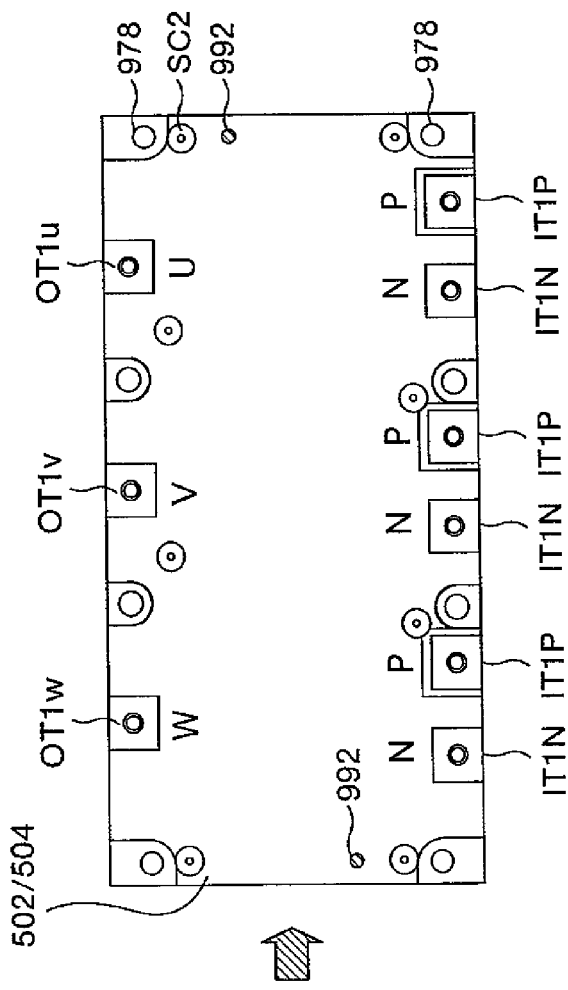
FIG. 20A is an outer plan view of the power module of the invention.
Figure 20C:
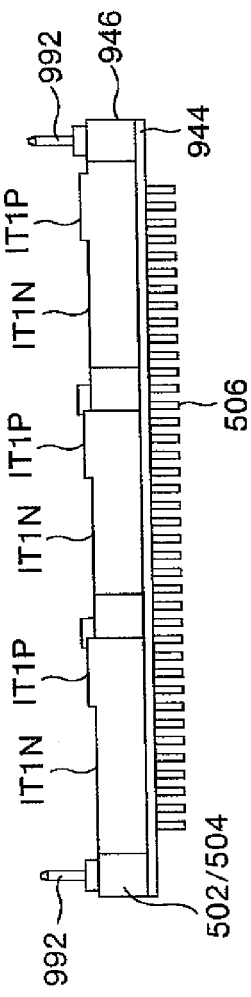
FIG. 20C is a front view thereof.

FIGS. 20(A)-(C) are outer views of the power module 502 or 504. FIG. 20(A) is a plan view of the power module 502 or 504, FIG. 20(B) is a side view thereof, and FIG. 20(C) is a front view thereof. As described above, the power module shown in FIGS. 16 and 17 does not include the resin case shown in FIG. 20. Incidentally, the heat radiating fin 506 in FIGS. 16 and 17 has the wave shape other than the pin shape. In FIG. 20(A) as the plan view, the terminals OTiu, OTiv and OTiw for the alternating current to be connected to the rotary motor are arranged at an end. Thee sets of terminals IT1N and IT1P for the direct current to be connected to the direct current electric source are arranged at another end as opposite side. These terminals are arranged as shown in FIG. 9 to be connected to the terminals of the capacitor. incidentally, the terminal IT1N is connected to a negative side of the direct current electric source, and the IT1P is connected to a positive side of the direct current electric source. The terminals for the positive side are electrically connected to each other in parallel, and the terminals for the negative side are electrically connected to each other in parallel, in the three sets of the terminals IT1N and IT1P for the direct current in FIG. 20.

Datum pins 992 are arranged to position the drive circuit 602 or 604 fixed to the power modules 502 or 504.

FIG. 21 shows a positional relationship between the power module 502 and the power module 504 with the radiating fins thereof fixedly projecting in the openings 219 and 219 of the water path 022 and 926. An arrow mark shows a direction of water flow in the water path. The power module 502 and the power module 504 are arranged in parallel while those terminals for the direct current are arranged at the inside. This arrangement enables the connection to the terminals of the capacitor at the central region so that the structure of the apparatus is simplified as the whole. Further, the connection to the capacitor modules 302 and 304 can be obtained through short length of the interconnection lines with the positive and negative sides for the direct current facing to each other so that an inductance of the interconnection lines is decreased to restrain a surge of voltage caused by the switching operation of the power modules 502 and 504.

Further, in this apparatus, IP1P and IT2P are connected to the positive pole of the direct current electric power source, and IP1N and IT2N are connected to the negative pole of the direct current electric power source. As shown in FIG. 21, the power modules 502 and 504 are arranged in parallel with a small shift therebetween so that the power modules 502 and 504 can have the identical shape. Further, a distance of the interconnection is shortened to decrease the inductance. N terminals of the power modules 502 and 504 can be arranged to be close to each other, and P terminals of the power modules 502 and 504 can be arranged to be close to each other. Therefore, an arrangement of the interconnection lines are simplified to decrease the inductance and make the wiring operation easy.

Since the terminals OT1 and OT2 for alternating current to be connected to the rotary motor are arranged at the outside of the power module 502 or 504 arranged in parallel, bus bars for connecting the terminals OT1 and OT2 for alternating current to another rotary motor can be easily arranged. The structure of the apparatus is simple as the whole to improve operability.

<Explanation of Electric Circuit>

Figure 22:
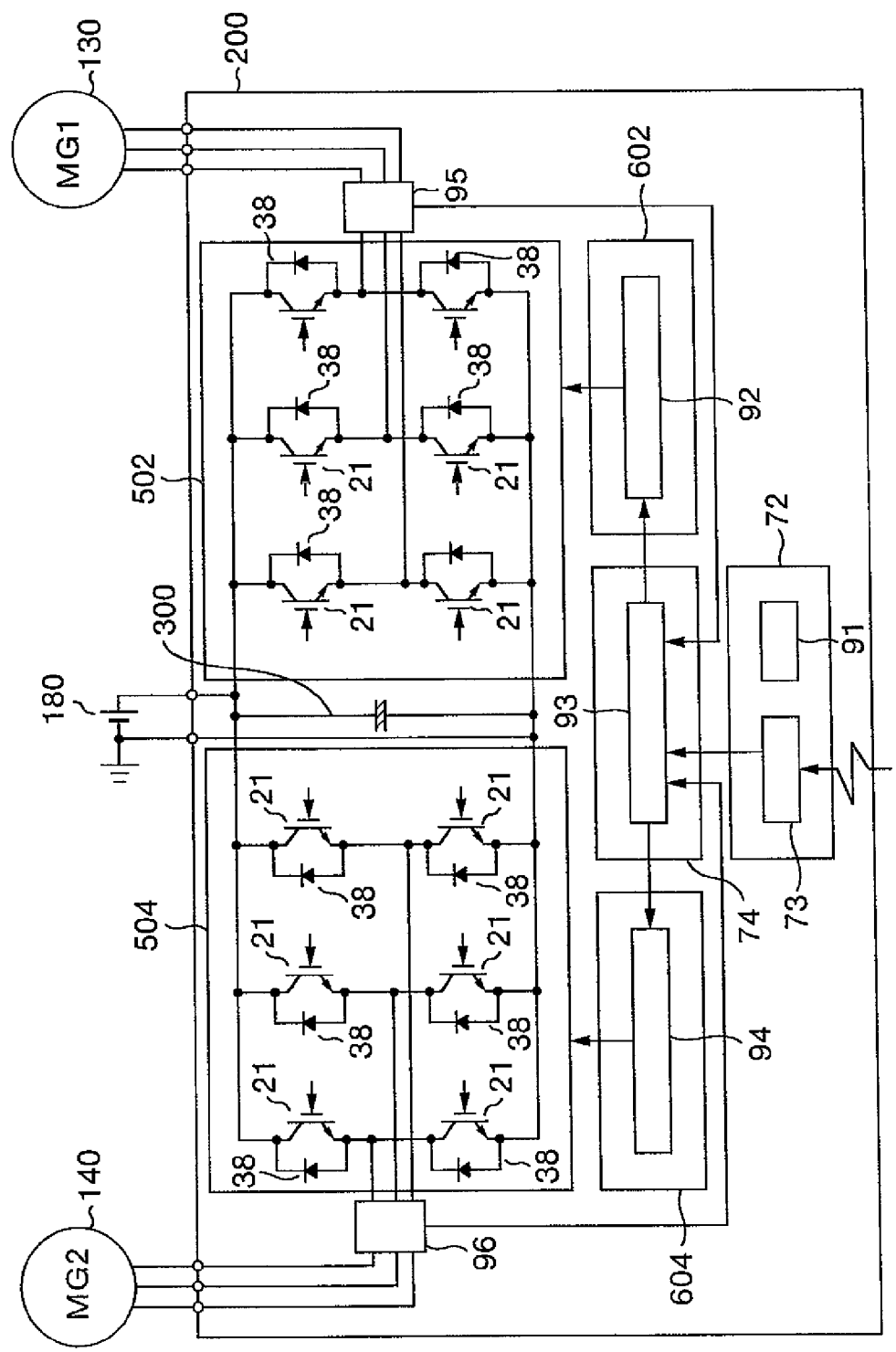
FIG. 22 is a diagram of a circuit of the invention.
Figure 23:
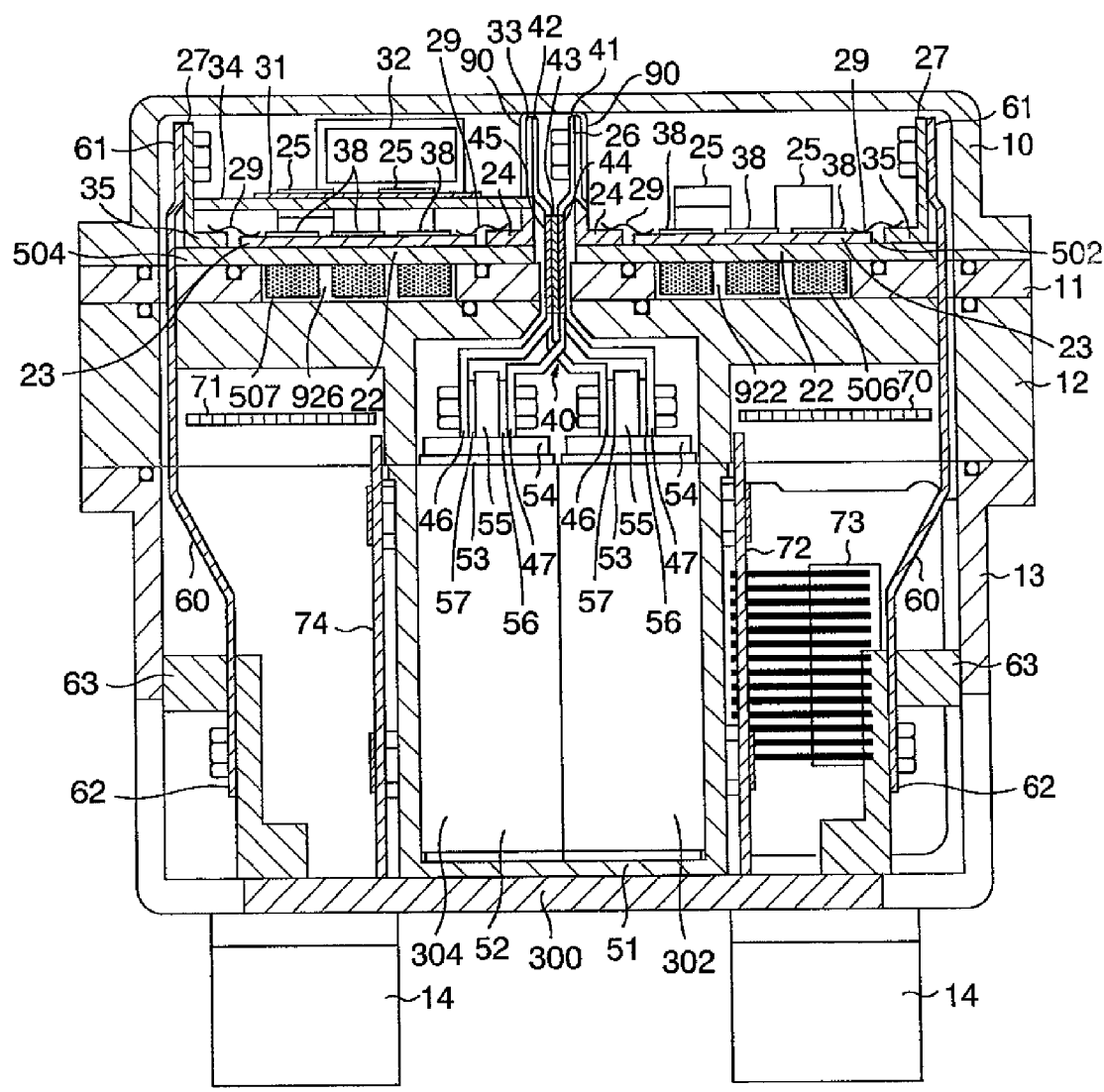
FIG. 23 is a cross sectional view showing the power converter of the second embodiment of the invention.

FIG. 22 is a view of a circuit of the power converter 200 of the embodiment, and the power converter 200 includes the first power module 502 as the inverter, the second power module 504 as the inverter, the capacitor module 300, the drive circuit 92 mounted on the first drive circuit substrate 602 of the inverter, the drive circuit 94 mounted on the second drive circuit substrate 604 of the inverter, the control circuit 93 mounted on the rotary motor control circuit substrate 700, a connector 73 mounted on the connector substrate 72, a drive circuit 91 for driving the electric discharge circuit (not shown) of the capacitor module 300, and electric current sensors 95 and 96.

Incidentally, in FIG. 22, the electric power source system is indicated by solid lines, and the signal system is indicated by dot-lines to clearly distinguish the electric power source system and the signal system from each other.

The first power module 502 and the second power module 504 form a main circuit for converting the electric power in the corresponding inverters, and each of then includes a plurality of power semiconductor elements for switching. The first power module 502 and the second power module 504 are operated by driving signals output from the driving circuits 92 and 94 respectively to convert the direct current electric power supplied from the high voltage battery 180 to three-phase alternating current electric power to be supplied to respective rotor coils of the rotary motors 130 and 140. The main circuit is a three-phase bridge circuit as shown in FIG. 22, and the series circuits for the three phases are connected in parallel between the positive pole side and the negative pole side of the battery 180. The series circuit is formed by semiconductor chips 952 adhered to the insulating substrates 956 facing to each other. The semiconductor chips of the first power module 502 and the second power module 504 as shown in FIG. 22 are arranged as shown in FIG. 16.

<Explanation of Second Power Module 504>

The first power module 502 and the second power module 504 have the identical circuit arrangement as shown in FIG. 22, whereby the second power module 504 is explained as the representative. In this embodiment, IGBT (isolated gate type bipolar transistor) 21 is used as the power semiconductor element for switching. The IGBT 21 has a collector electrode, an emitter electrode and a gate electrode. A diode 38 is connected to the collector electrode and the emitter electrode. The diode 38 has a cathode electrode connected to the collector electrode of the IGBT 21 and an anode electrode connected to the emitter electrode of the IGBT 21 so that a forward direction is directed from the emitter electrode to the collector electrode in the IGBT 21. The IGBT 21 corresponds to the semiconductor chip 952 in FIGS. 16, 18 and 19, and the diode 38 corresponds to the diode chip 954 in the above drawing. As explained above, MOSFET (metal oxide semiconductor field-effect transistor) may be used as the power transistor for switching. The MOSFET has three electrodes of drain electrode, source electrode and gate electrode. Incidentally, the MOSFET includes a parasitic diode the forward direction is directed from the drain electrode toward the source electrode between the source electrode and the drain electrode, it does not need to include an additional diode needed by the IGBT.

The arm of each phase is constituted by the source electrode of the IGBT 21 and the drain electrode of the IGBT 21 electrically connected to each other in series. Incidentally, in this embodiment, although only the IGBT of each of upper and lower arms of each phase is shown, the plurality of the IGBTs are electrically connected in parallel to control a great amount of the electric current. In the embodiment shown in FIG. 22, each of the upper and lower arms of each phase is constituted by thee of the IGBTs. The drain electrode of the IGBT 21 of each of the upper arms of each phase is electrically connected to the positive pole side of the battery 180, and the source electrode of the IGBT 21 of each of the lower arms of each phase is electrically connected to the negative pole side of the battery 180. The terminals of the semiconductor modules 502 and 504 to be connected to the positive pole side of the battery 180 are denoted by IT1P and IT2P in FIGS. 20 and 21. Further, the terminals of the semiconductor modules 502 and 504 to be connected to the negative pole side of the battery 180 are denoted by IT1N and IT2N in FIGS. 20 and 21.

A central point of the each of the arms of each phase (a joint portion between the source electrode of IGBT of upper arm side and the drain electrode of IGBT of lower arm side) is electrically connected to the rotor coil of corresponding phase of corresponding one of the rotary motors 130 and 140. The central points are denoted by OT1u, OT1v, OT1w, OT2u, OT2v and OT2w in FIGS. 20 and 21.

The drive circuits 92 and 94 are driving parts of the respective inverters to generate driving signals for driving the IGBT 21 in accordance with the control signal output by the control circuit 93. The driving signal generated by the circuit 92 or 94 is output to the corresponding one of the first power module 502 and the second power module 504. The drive circuits 92 and 94 are constituted by an integrated circuit containing as single block the plurality of the circuits corresponding to the upper and lower arms of each phase to drive six of the IGBTs. The circuits corresponding to the upper and lower arms of each phase includes interface circuits, gate circuits, abnormality detecting circuits and so forth.

The control circuit 93 is a micro-computer calculating the control signal (control value) to operate (on-off) the plurality of the power semiconductor elements for switching as a controller of each of the invertors. A torque ordering signal (torque ordering value) and signals (sensor output) detected by electric current sensors 95 and 95 and rotary sensors mounted on the rotary motors 130 and 140 are input into the control circuit 93. The control circuit 93 calculates the control values on the basis of these input signals to output the control signals for controlling the switching timing of the drive circuits 92 and 94.

The connector 73 connects electrically the power converter 200 and the external controller to each other to input and output the information to and from another apparatus through the communication line 174 in FIG. 1.

The capacitor module 300 has capacitor modules 302 and 304 shown in FIG. 10 as the smoothing circuit for restraining the variation of the direct current voltage caused by the switching operation of the IGBTs 21, and is electrically connected in parallel to the terminals at the direct current side of the first power module 502 and the second power module 504.

The drive circuit 91 drives the electric discharge circuit (not shown) to discharge electric charge stored in the capacitor module 300.

Second Embodiment

Next, with making reference to FIGS. 23-28, the second embodiment is explained. The above described circuits shown in FIG. 22, the structure of the power module shown in FIGS. 16-21 and the basis structure of the coolant water path shown in FIGS. 12-15 are common with respect to the second embodiment. A difference is that the power converter 200 of the first embodiment has the coolant water paths 922 and 926 at the bottom, the power converter 200 of the second embodiment has the coolant water paths at the middle area. In the second embodiment, the electric parts to be cooled such as the power modules 502 and 504 and the capacitor modules 302 and 304 are mounted on both surfaces of the coolant water path forming body so that the cooling is performed at the both surfaces. For example, the semiconductor modules such as the power modules 502 and 504 are mounted on one of the surfaces of the coolant water path forming body to be cooled, and the capacitor modules 302 and 304 are mounted on the other one of the surfaces of the coolant water path forming body to be cooled.

The second embodiment of the power converter is described below. The power converter 200 is fixed with a stacked manner in which a second base 12 is mounted on the lower case 13, the first base 11 is mounted on the second base 12, and the upper case 10 is mounted on the first base 11. An outer appearance of the power converter 200 as the fixedly stacked housing has a generally rectangular shape with rounded corners. The components of the housing is made of high thermal conductivity material such as aluminum. The housing has basically the same performance as the housing 210 explained as the first embodiment, and includes the lower case 13 and the upper case 10. The water path forming body constituted by the first base 11 and the second base 12 is fixed to the central portion of the housing formed by the cases, and the electric parts such as the power modules and the capacitor modules are mounted on the both surfaces of the water path forming body as described below.

The housing is surrounded at its whole periphery (peripheral wall, roof wall and bottom wall) by a member of high thermal conductivity such as aluminum, and the coolant water path formed by the first and second bases 11 and 12 is fixed to the housing with a high thermal conductivity structure so that the housing is effectively cooled. In the housing, the coolant water path is formed by the water path forming body constituted by the first and second bases 11 and 12 so that upper and lower chambers of the water path forming body are formed in the housing. The water path forming body includes two cooling water paths 922 and 926 in parallel for a flow of the coolant water as the coolant. By the above described structure, the two chambers are thermally isolated from each other by the coolant water path to restrain a thermal interference between the chambers. Further, the rooms and room walls are cooled respectively.

Figure 24:
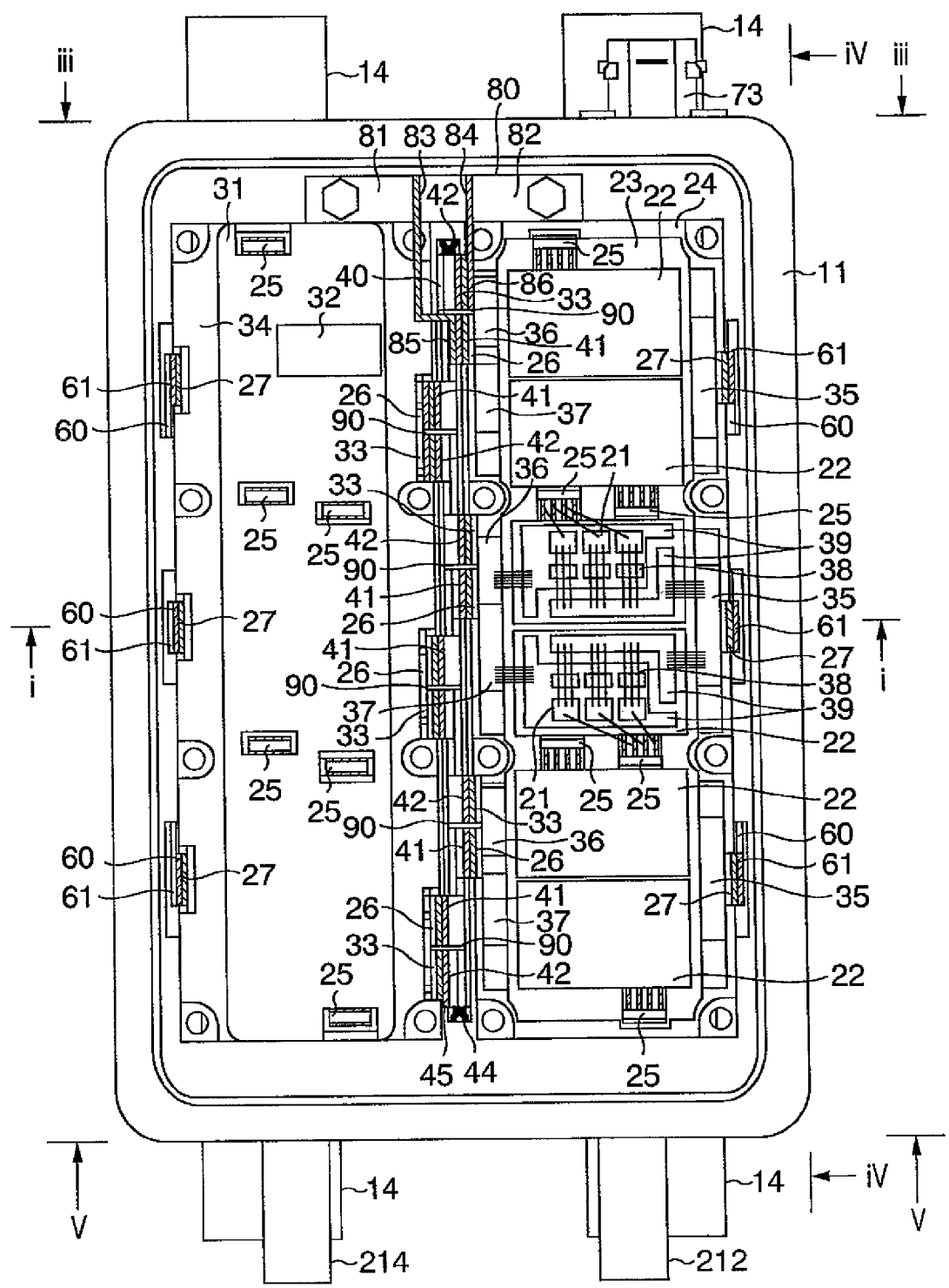
FIG. 24 is a plan view of an upper part of water path of the power converter of the second embodiment.
Figure 25:
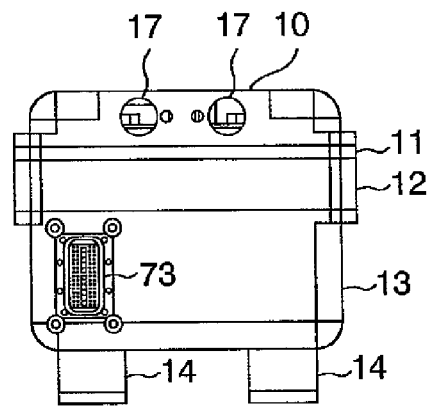
FIG. 25 is a side view of the power converter of the second embodiment.
Figure 26:
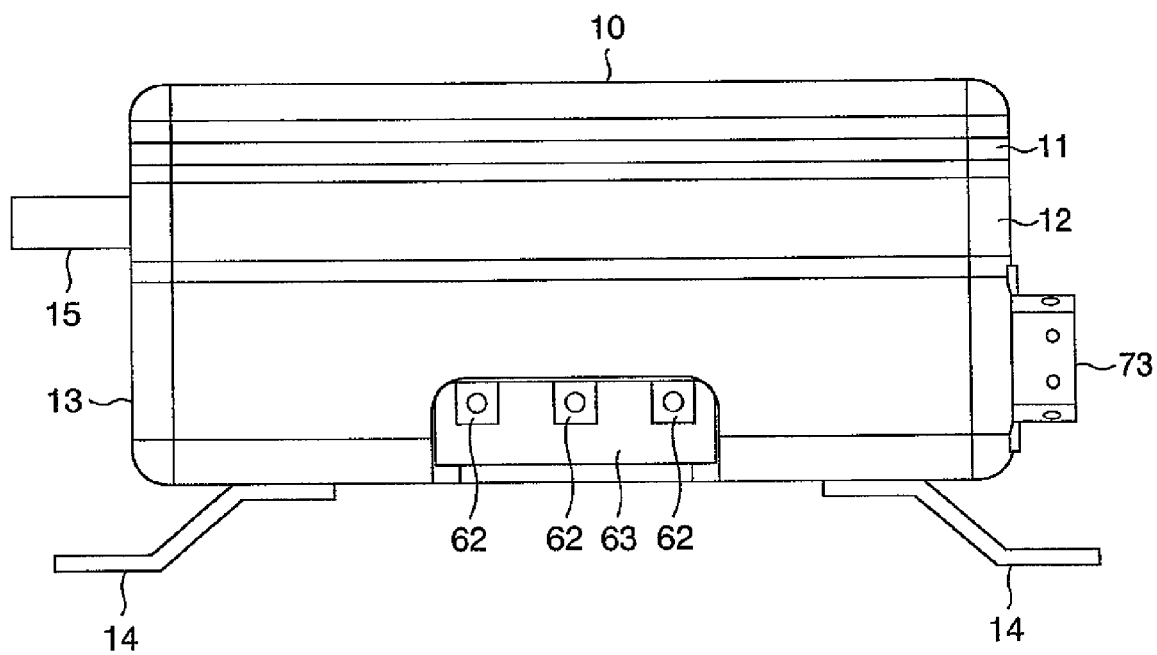
FIG. 26 is a side view of the power converter of the second embodiment.
Figure 28:
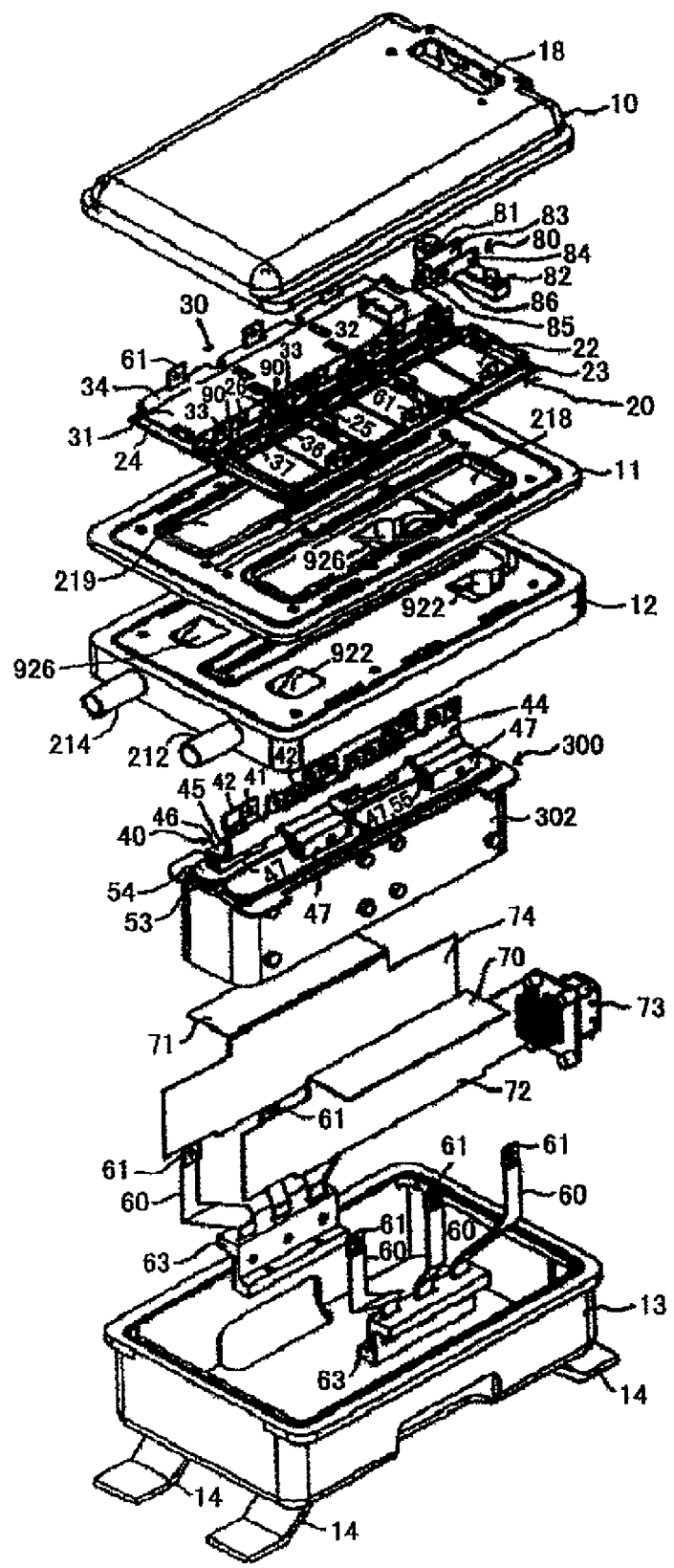
FIG. 28 is an exploded oblique projection view of the power converter of the second embodiment.

In the upper chamber of the water path forming body, the first power module 502 and the second power module 503 are juxtaposed with each other along the longitudinal direction of the housing as shown in FIGS. 24 and 28. The openings 218a and 219 are formed on the coolant water path 922 and 926 as shown in FIGS. 12 and 13, and the openings 218 and 219 are closed by the heat radiating surfaces of the base plates 23 of the first power module 502 and the second power module 503 so that the first power module 502 and the second power module 503 are cooled efficiently. Further, the heat energy discharged from the first power module 502 and the second power module 503 is restrained from affecting thermally the lower chamber.

Figure 27:
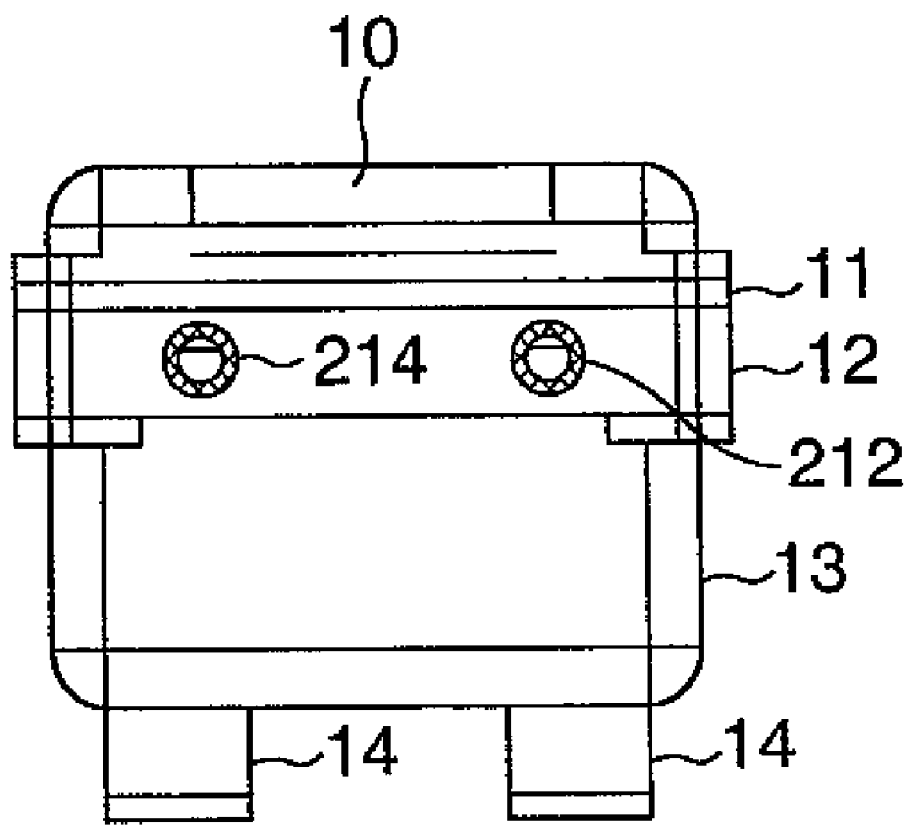
FIG. 27 is a side view of the power converter of the second embodiment.

The inlet pipe 212 and outlet pipe 214 communicating with the coolant water path 922 and 926 are arranged at one of side surfaces of the housing aligned in its longitudinal direction as shown in FIG. 27. The coolant water path 922 and 926 extend parallel to each other along the longitudinal direction of the housing, and are bent to communicate with each other at the other end in the longitudinal direction of the housing. The shape of the water path shown in FIGS. 12-14 and the shape of the water path of the second embodiment are substantially identical to each other.

The openings 218 and 219 (refer to FIG. 28) are arranged on the coolant water path 922 and 926 of the first base 11, the heat radiating fins arranged on the power module 502 and the second power module 504 project into the water path from the openings 218 and 219, and the openings 218 and 219 are closed by the base plate 3 of the power modules 502 and 504. The fins are directly cooled by the coolant, and the base plate 23 is efficiently cooled by the coolant flowing in the coolant path (water path 922 and 926).

The base plate 23 is identical in shape and functional effect to the base plate 944 as shown in FIGS. 18 and 19, made of metallic material of high thermal conductivity with a main component of copper, and the heat radiating fins projecting into the coolant path (water paths 922 and 926) are attached to a surface facing to the coolant path. The heat radiating fins are identical in structure to the heat radiating fins 506 and 507 shown in FIGS. 18 and 19 to increase a surface area cooled by the coolant so that a cooling effect by the coolant is improved.

As shown in FIG. 28, the coolant water supplied from the inlet pipe 212 is made deep at the inlet part of the first water path 922, and subsequently is made shallow at the area of the first water path at which the heat radiating fin 506 projects. The fold back portion of the water path as the joint between the first water path 922 and the second water path 926 is made deeper in comparison with the area at which the heat radiating fin 506 projects, and the area of the second water path 926 at which the heat radiating fin 507 projects is made shallow. The outlet part of the second water path 926 is made deeper in comparison with the area at which the heat radiating fin projects, and is connected to the outlet pipe 214. The shape and functional effect of this water path is identical to the shape shown in FIGS. 12, 13 and 14, a heat exchange of the coolant water is efficiently performed at the area at which the heat radiating fin projects, and the flow resistance is decreased at the area the heat radiating fin does not project so that the cooling efficiency of the cooling system as the whole is improved.

The metallic base plates 23 of the power modules 502 and 504 close respectively the openings of the water paths, and the resin case 24 shown in FIGS. 15-21 is arranged on the upper surface of the base plates 23. The resin case 24 shown in FIGS. 23-28 are identical to the resin cases 946 shown in FIGS. 14, 15 and 20. Incidentally, in FIGS. 23, 24 and 28, the upper cover of the resin case 24 of the first power module 502 is eliminated to clearly show the inside of the power module 502. Further, only central two of combinations of the semiconductor chips and interconnection line arrangements adhered to the six insulating substrates 22 of the first power module 502 at right column in FIG. 24 are shown, but the other four of the semiconductor chips adhered to the insulating substrates 22 are eliminated.

The module terminals 26 (refer to FIG. 24) of the direct current positive pole side and the module terminals 33 (refer to FIG. 24) of the direct current negative pole side are arranged on the side wall of the resin case extending in its longitudinal direction and facing to the first power module 502 and the second power module 504 to correspond to respective containing chambers. The module terminals 33 of the direct current positive pole side and the module terminals 26 of the direct current negative pole side project upward from the side of the resin case 24. Sides of the module terminals 33 of the direct current positive pole side and the module terminals 26 of the direct current negative pole side opposite to their projecting side extend into the containing chambers and their surfaces are exposed on the surface of the resin case. Therefore, the module electrodes 36 of the direct current positive pole side and the module electrodes 37 of the direct current negative pole side are formed in the containing chambers. The terminals 26 are identical to the terminals IT1P and IT2P of the first embodiment shown in FIGS. 20 and 21, and the terminals 33 are identical to the terminals IT1N and IT2N shown in FIGS. 20 and 21.

The alternating current module terminals 27 (refer to FIG. 24) are arranged on another side wall of the resin case extending in its longitudinal direction and arranged opposite to the side facing to the first power module 502 and the second power module 504. The alternating module terminals 27 project upward from the side wall of the resin case. The sides of the alternating current module terminals 27 opposite to their projecting side extend into the containing chambers, and the surfaces thereof are exposed on the surface of the resin case 24. Therefore, the alternating current module terminals 35 are formed in the containing chambers. The terminals 27 for the alternating current are identical in shape and functional effect to the terminals OT1u, OT1v, OT1w, OT2u, OT2u, OT2v and OT2w of the first embodiment shown in FIGS. 20 and 21.

The insulating substrates 22 of two are juxtaposed with each other in the longitudinal direction of the housing on the upper surface of the base plates 23 of the containing chambers. The wave-shaped interconnection line members 39 of two are juxtaposed with each other in the longitudinal direction of the housing on the upper surface of each of the insulating substrates 22. Sides of the interconnection line members 39 arranged a side of the two insulating substrate 22 of the containing chamber are electrically connected to the module electrodes 36 of the direct current positive pole side. The sides of the interconnection line members 39 arranged at the other side of the two insulating substrate 22 of the containing chamber are electrically connected to the module electrodes 38 of the direct current negative pole side. The other sides of the interconnection line members 39 are electrically connected to the alternating current module electrodes 35. These electric connections are performed by electrically conductive wires 29.

Three sets of the IGBT 21 and the diode 38 juxtaposed with each other in the longitudinal direction of the housing are juxtaposed with each other in the transverse direction of the housing on the upper surface of one side of the interconnection line members 39 arranged on the two insulating substrates 22 in the containing chambers. Therefore, the upper and lower arms of each phase are formed. The IGBT 21 and the diodes 38 are electrically connected to the interconnection line members 39 electrically connected to the alternating current module electrodes 35. The gate electrodes of the IGBT 21 are electrically connected to the connectors 25. These electric interconnections are performed by the electrically conductive wires 29. The connectors are arranged respectively on four side walls forming three regions of the upper surface of the base plate 23 of the resin case. The arrangement of the IGBT 21 and the diodes 38 is identical to the arrangement shown in FIG. 16. The insulating substrate 22 of the second embodiment is identical to the insulating substrate 956 of the first embodiment to perform the same functional effect.

The module case cover 34 of plate shape is arranged on the upper part of the resin case. The module case cover 34 forms the roof wall closing the upper opening of the resin case to close the containing chamber, and is made of the same material as the resin case. The interconnection line sheet 31 and the interconnection line connector 32 electrically connected to the interconnection line sheet 31 are arranged on the upper surface of the module case cover 34. The interconnection line sheet 31 is electrically connected to the connectors 25 projecting upward from the through holes of the module case cover 34. The interconnection line connector 32 is electrically connected to the drive circuits of the first drive circuit substrate 70 and second drive circuit substrate 71 by interconnection line not shown. The drive circuits are identical to the drive circuits 92 and 94 shown in FIG. 22, and are identical to the circuits of the drive circuits substrates 602 and 604 of the first embodiment.

The capacitor module 300 is arranged in the cooled chamber at the lower portion of the housing. The capacitor 300 includes the capacitor modules 302 and 304 similar to the condenser module 300 in the first embodiment or the circuit of FIG. 22.

The capacitor module 300 is arranged to position the electric terminals at the lower side of the central region (defined by two legs of $\pi$) of the second base 12 in the vicinity of the direct current side terminals of the first power module 502 and the second power module 504. The capacitor module 300 is constituted by four electrolytic capacitors of elliptical cross sectional shape in the height direction of the housing. The four electrolytic capacitors are arranged to juxtapose two of them in each of the longitudinal direction and the transverse direction while those longitudinal directions are parallel to the longitudinal direction of the housing, and are contained in the capacitor case 51 through the holder band 52. The capacitor case 51 is a thermally conductive container whose upper part is opened, and the lower ends of the two legs of 7 contact a flange of the upper part of the case. Therefore, the capacitor modules 300 and the coolant path (water paths 922 and 926) are thermally connected to each other with high thermal conductivity to cool sufficiently the capacitor module 300.

Each of the electrolytic capacitors has a positive pole side capacitor terminal 57 and a negative pole side capacitor terminal 56 extending through a capacitor cover 54 closing the opening of the upper part of the capacitor case 53. The positive pole side capacitor terminal 57 and negative pole side capacitor terminal 56 of plate shape face to each other in the transverse direction to arrange an insulating member 55 of plate shape formed monolithically with the capacitor cover 54 between them. The capacitor terminals are arranged to differentiate longitudinal positions thereof adjacent to each other in the transverse direction from each other when the four electrolytic capacitors are contained by the capacitor case 53.

The first drive circuit substrate 70 is arranged in a region surrounded by one of the legs of $\pi$ and the flange of the second base 12 in the lower side of the second base 12 adjacent to the power module 502. The second drive circuit substrate 71 is arranged in a region surrounded by the other one of the legs of $\pi$ and the flange of the second base 12 in the lower side of the second base 12 adjacent to the power module 504. The drive circuit substrates 70 and 71 are thermally connected to each other. Therefore, the coolant path and the drive circuit substrates 70 and 71 are thermally connected to each other to cool the drive circuit substrates 70 and 71 with the coolant water as the coolant.

The rotary motor control circuit substrate 74 faces to a side surface of the capacitor case 53 at one of sides thereof in the transverse direction (adjacent to the second power module 504). The rotary motor control circuit substrate 74 is thermally connected to the second base 12. Therefore, the coolant path (water paths 922 and 926) and the rotary motor control circuit substrate 74 are arranged with high thermal conductivity to cool efficiently the rotary motor control circuit substrate 74 with the coolant.

The connector substrate 72 faces to a side surface of the capacitor case 53 at the other one of sides thereof in the transverse direction (adjacent to the first power module 502). The rotary motor control circuit substrate 72 is thermally connected to the second base 12. Therefore, the coolant path 28 and the connector substrate 72 are thermally connected to each other to cool the connector substrate 72 with the coolant. The connector 73 projects outward from the side end surface of the other side of the housing in the longitudinal direction.

The capacitor module 300 is electrically connected to the first power module 502 and the second power module 504 through the direct current side connecting conductive body 40. The direct current side connecting conductive body 40 extends an elongated through hole (elongated in the longitudinal direction of the housing) extending at central portions of the first base 11 and second base between the upper and lower cooled chambers in the height direction of the housing.

The direct current side connecting conductive body 40 is an interconnection line member of laminated structure in which a direct current positive pole side bus bar 45 of plate shape extending in the longitudinal direction of the housing and a direct current negative pole side bus bar 44 of plate shape extending in the longitudinal direction of the housing are stacked through the insulating sheet 43 in the transverse direction of the housing, the direct current positive pole side module terminal 44 and the positive pole side capacitor terminal 46 are integrally formed with the direct current positive pole side bus bar 45, and the direct current negative pole side module terminal 41 and the negative pole side capacitor terminal 47 are integrally formed with the direct current negative pole side bus bar 44. In this structure, a low inductance is obtainable between the capacitor module 50 and the first power module 502 and second power module 504 so that the temporary increase in voltage during the stitching operation of the IGBT 21 is restrained. Further, since the temporary increase in voltage is restrained even when the switching speed is increased, the switching speed can be increased while the heat generation of the semiconductor during the stitching operation is restrained.

The module terminal 42 of the direct current positive pole side extends upward from the upper part of the direct current positive side bus bar 45 at a position where the module terminal 33 at the direct current positive pole side projects upward from the resin case, and is fixed by screw or the like to the direct current positive pole side module terminal 33 while facing to the direct current positive pole side module terminal 33 in the transverse direction of the housing to be electrically connected to the direct current positive pole side module terminal 33. The direct current negative pole side module terminal 41 extends upward from the upper part of the direct current negative pole side bus bar 44 at a position where the direct current negative pole side module terminal 26 projects upward from the resin case, and is fixed by screw or the like to the direct current negative pole side module terminal 26 while facing to the direct current negative pole side module terminal 26 in the transverse direction of the housing to be electrically connected to the direct current negative pole side module terminal 26.

The capacitor terminal 46 at the positive pole side and the capacitor terminal 47 at the negative pole side extends downward from the lower part of the direct current positive pole side bus bar 45 and the direct current negative pole side bus bar 44 at a position where the capacitor terminal projects to arrange the capacitor terminals therebetween in the transverse direction of the housing, and are fixed by screw or the like to the capacitor terminals of the same pole while facing to them to be electrically connected to the capacitor terminals of the same pole. In this interconnection line structure, the positive side and negative side of the interconnection lines to the capacitor terminals from the direct current positive pole side bus bar 45 and the direct current negative pole side bus bar 44 face to each other to decrease the inductance of the interconnection lines so that the temporary increase in voltage is decreased during the switching operation of the IGBT 21. Further, since the temporary increase in voltage is decreased even when the switching speed is increased, the switching speed is increased by the decrease of inductance while keeping the increased voltage unchanged, so that the heat generation of the semiconductor is restrained during the switching operation.

In the above embodiment, the coolant water paths are arranged in parallel, and the terminals of the capacitor module 300 are connected to the direct current terminals of the power modules 502 and 504 as the semiconductor modules through holes between the coolant water paths to improve the cooling efficiency and decrease the inductance.

The direct current terminal 80 is arranged at the end of the other side of the housing in the longitudinal direction thereof. The direct current terminal 80 includes the external terminal 82 of the direct current positive pole side, the external terminal 81 of the direct current negative pole side, the connecting terminal 86 of the direct current positive pole side, the connecting terminal 85 of the direct current negative pole side, the bus bar 84 at the direct current positive pole side for connecting the external terminal 82 of the direct current positive pole side and the connecting terminal 86 of the direct current positive pole side, and the bus bar 83 at the direct current negative pole side for connecting the external terminal 81 of the direct current negative pole side and the connecting terminal 85 of the direct current negative pole side.

The external terminal 82 of the direct current positive pole side and the external terminal 81 of the direct current negative pole side are electrically connected to external cables extending through a connector mounted in a through hole 17 formed on the side end surface of the other side of the housing in the longitudinal direction thereof. The bus bar 84 at the direct current positive pole side and the bus bar 83 at the direct current negative pole side extend along the first power module 502 and the second power module 504 to face to each other in the transverse direction of the housing. The connecting terminal 86 of the direct current positive pole side is electrically connected to the module terminals 33 and 42 of the direct current positive pole side, and the connecting terminal 85 of the direct current negative pole side is electrically connected to the module terminals 26 and 41 of the direct current negative pole side.

The hole 18 formed on the upper surface of the upper case 10 is used to a connecting work between the external cables and the external terminals 82 and 81 of the direct current positive and negative pole sides, and is closed by the cover during a time period other than the connecting work time.

The alternating current bus bars 60 for three phases are arranged at each of internal ends of the housing in the transverse direction thereof. The alternating current bus bars 60 extend from the lower chamber of the coolant water path to the upper chamber of the coolant water path through the vertical (in the height direction of the housing) through hole formed at the ends of the first base 11 and second base 12 in the transverse direction of the housing. The module terminal 61 at the alternating side is formed on the end of the alternating bus bar 60 in the upper chamber of the water path, and faces to the module terminal 27 at the alternating current side in the transverse direction of the housing to be fixed to the module terminal 27 at the alternating current side by screw or the like to be electrically connected to the module terminal 27 at the alternating current side. The external connecting terminal 62 for the external cables connected to the rotary motors 130 and 140 is formed at the other end side of the alternating bus bar 60 in the lower chamber of the water path, and is supported by the terminal holder 63.

Incidentally, a reference number 14 denotes an attaching leg for fixing the housing of the power converter 200 to the housing of the transmission 105 or the housing of the transmission 105 and engine 104, which leg is made of a rigid body such as SUS to keep a strength. Further, it has a bent shape to achieve an elasticity for restraining a vibration from the transmission and engine 104.

In the above described first and second embodiments, the coolant water path has the opening through which the heat radiating fin projects into the water path to cool directly the heat radiating fin with the coolant water as the coolant, so that the cooling efficiency is improved.

In the above described first and second embodiments, in addition to direct cooling of the heat radiating fin with the coolant water, the opening is closed by the metallic base plate to which the heat radiating fin is adhered, so that the structure of the apparatus is simplified in addition to the improvement of the cooling efficiency.

In the above described first and second embodiments, in addition to direct cooling of the heat radiating fin with the coolant water, the direct current terminals of the power module containing therein the switching semiconductor as the inverter and including the heat radiating fin are aligned at one side of the power module, so that a connecting structure to the capacitor module is simplified and the inductance is decreased.

In the above described first and second embodiments, the coolant water paths are arranged in parallel, the openings of the coolant water paths are arranged in parallel, the cooling fins projects in the openings respectively to be directly cooled, and the direct current terminals of the power module containing therein the switching semiconductor as the inverter and the heat radiating fin are aligned at the inside of the water paths arranged in parallel, so that the connecting structure to the capacitor module is simplified, and the inductance is decreased. Further, since the capacitor module is divided to a plurality of parts arranged in parallel, and the terminals of the capacitor module are arranged at the inside of the parallel arrangement, the inductance of the direct current circuit is decreased in addition to the improvement of the cooling efficiency and simplifying the structure as the whole.

In the above power module, the metallic base plate holding the semiconductor element and the heat radiating fin is made of a material including copper and the other metal to increase the hardness. Therefore, a deterioration in flatness caused by fixing the fin by brazing is restrained to make the subsequent adhesion of the insulating substrate including the plurality of the semiconductor chips easy. Further, the plurality of the insulating substrates are easily adhered to the common base plate, and a reliability thereof is kept after a long time period of use.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A power convertor comprising:
    a cooling path forming body forming a path for refrigerant, and
    a power module fixed to the cooling path forming body and including a plurality of power semiconductor chips for converting a direct electric current to an alternating electric current,
    wherein the power module further includes a base plate, a heat radiating element fixed to a surface of the base plate through a brazing material, and an insulating substrate, a surface of which is fixed to another surface of the base plate through a solder layer, and
    the base plate is made of copper alloy including a material whose hardness is higher than a hardness of copper, has a hardness not less than HV50, and has a thermal conductivity not less than 200 W/mK,
    wherein the cooling path forming body includes an opening communicating with the path, the heat radiating element projects from the opening into the path, the power module is fixed to the cooling path forming body in such a manner that the opening is closed by the base plate,
    wherein each of the power semiconductor chips is fixed to another surface of the insulating substrate through a second solder layer, and
    a melting point of the second solder layer is lower than a brazing temperature of the brazing material through which the heat radiating element is fixed to the surface of the base plate, and higher than a melting point of the solder layer.

2. The power convertor according to claim 1, wherein a part of the base plate facing to the insulating substrate has a flatness not more than 0.2 mm.

3. The power convertor according to claim 2, wherein another part of the base plate facing to the power semiconductor chip has a flatness not more than 0.4 mm.

4. The power convertor according to claim 1, wherein the heat radiating element includes a heat radiating fin of wave shape.

5. The power convertor according to claim 1, wherein the heat radiating element includes a heat radiating fin of pin shape.

6. The power convertor according to claim 1, wherein the heat radiating element includes first, second and third heat radiating parts,
    the base plate has a first base area onto which the first radiating part is fixed, a second base area onto which the second radiating part is fixed, and a third base area onto which the third radiating part is fixed,
    the insulating substrate includes a first insulating area on which a switching element for outputting U-phase component of the alternating current, a second insulating area on which a switching element for outputting V-phase component of the alternating current, and a third insulating area on which a switching element for outputting W-phase component of the alternating current,
    the first insulating area faces to the first base area through the solder layer, the base plate and the brazing material,
    the second insulating area faces to the second base area through the solder layer, the base plate and the brazing material, and
    the third insulating area faces to the third base area through the solder layer, the base plate and the brazing material.

7. The power convertor according to claim 1, wherein a thickness of the base plate is 2-4 mm.

8. The power convertor according to claim 1, wherein the base plate is plated with nickel of thickness of about 3-9 μm.

* * * * *